United States Patent
Vega et al.

(10) Patent No.: US 12,557,341 B2
(45) Date of Patent: Feb. 17, 2026

(54) NEGATIVE CAPACITANCE GATE-ALL-AROUND TRANSISTOR WITH TUNABLE CAPACITANCE RATIO

(71) Applicant: International Business Machines Corporation, Armonk, NY (US)

(72) Inventors: Reinaldo Vega, Mahopac, NY (US); Julien Frougier, Albany, NY (US); Ruilong Xie, Niskayuna, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 18/231,884

(22) Filed: Aug. 9, 2023

(65) Prior Publication Data

US 2025/0056839 A1    Feb. 13, 2025

(51) Int. Cl.
*H10D 30/67* (2025.01)
*H10D 30/43* (2025.01)
*H10D 62/10* (2025.01)
*H10D 84/85* (2025.01)

(52) U.S. Cl.
CPC ......... *H10D 30/6735* (2025.01); *H10D 30/43* (2025.01); *H10D 62/121* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 8,988,173 B2 | 3/2015 | Hitko et al. | |
| 9,263,577 B2* | 2/2016 | Ramaswamy | H10D 30/0415 |
| 9,900,008 B1 | 2/2018 | Lee | |
| 10,003,326 B1 | 6/2018 | Lee | |
| 10,170,520 B1 | 1/2019 | Frougier et al. | |
| 11,217,694 B2 | 1/2022 | Xu et al. | |
| 11,296,204 B2 | 4/2022 | Ha et al. | |
| 11,322,505 B2* | 5/2022 | Young | H10B 51/30 |
| 11,437,371 B2 | 9/2022 | Yang et al. | |
| 11,501,812 B2 | 11/2022 | Wang et al. | |
| 2017/0162702 A1* | 6/2017 | Hu | H10D 64/689 |
| 2018/0323309 A1 | 11/2018 | Ando et al. | |
| 2019/0115444 A1* | 4/2019 | Bentley | H10D 30/62 |

(Continued)

FOREIGN PATENT DOCUMENTS

| | | |
|---|---|---|
| CN | 101832750 A | 9/2010 |
| CN | 201731889 U | 2/2011 |

(Continued)

OTHER PUBLICATIONS

Hoffman, M., et al., "Unveiling the double-well energy landscape in a ferroelectric layer", Nature, Jan. 24, 2019, 12 pages, vol. 565.

*Primary Examiner* — Cory W Eskridge
(74) *Attorney, Agent, or Firm* — Scully, Scott, Murphy & Presser, P.C.; Kimberly Zillig

(57) ABSTRACT

A semiconductor structure is provided that includes a tunable and shared non-conductive layer as part of a gate stack of at least a pair of nanosheet GAA transistors with a shared metal gate electrode. The semiconductor structure has a tunable non-conductive material/gate dielectric area ratio where the non-conductive material is not constrained to a periphery of the nanosheet stack cross section.

20 Claims, 21 Drawing Sheets

(56) References Cited

U.S. PATENT DOCUMENTS

| | | |
|---|---|---|
| 2019/0267446 A1 | 8/2019 | Hou et al. |
| 2022/0036935 A1* | 2/2022 | Wang ..................... H10B 51/30 |
| 2023/0041159 A1* | 2/2023 | Zhang ................. H10D 64/017 |

FOREIGN PATENT DOCUMENTS

| | | |
|---|---|---|
| CN | 103636122 B | 6/2016 |
| CN | 109063251 A | 12/2018 |
| CN | 106716828 B | 9/2020 |
| JP | 2017523643 A | 8/2017 |
| JP | 2017528013 A | 9/2017 |
| TW | I657492 B | 4/2019 |

* cited by examiner

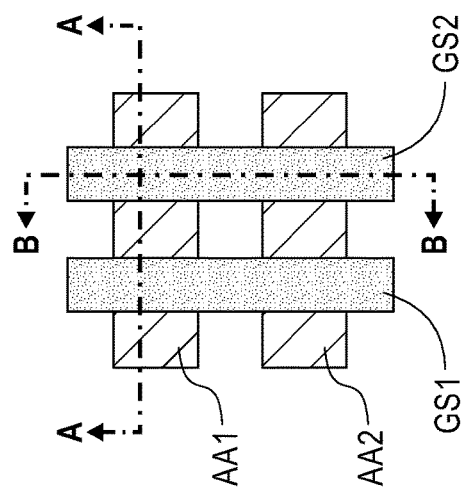
FIG. 1
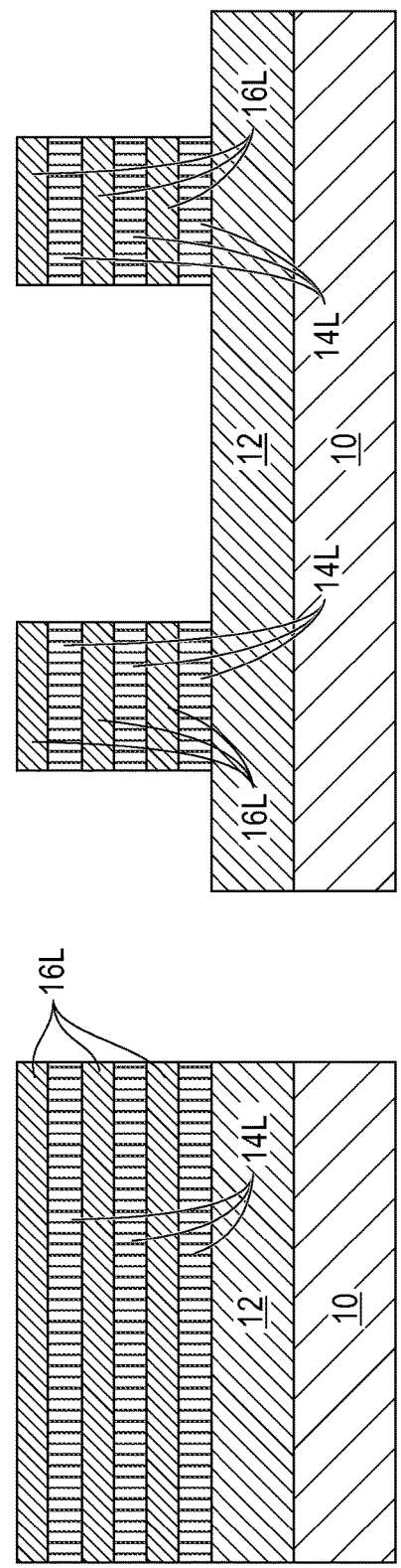
FIG. 2B
FIG. 2A

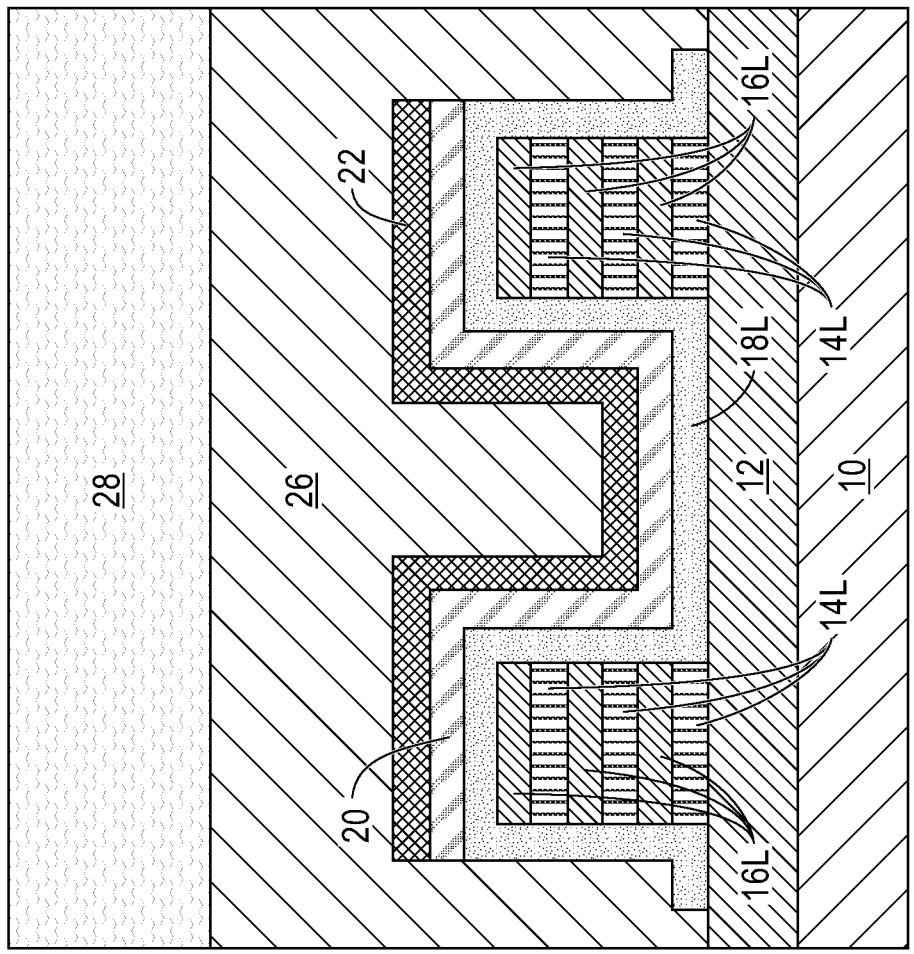
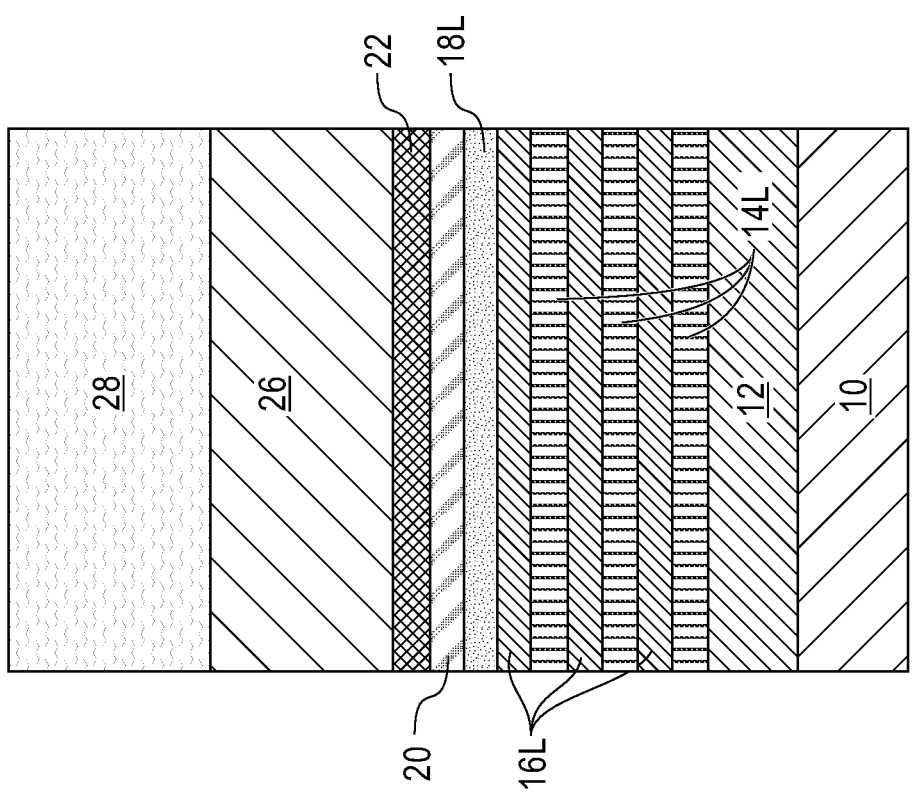
FIG. 7A
FIG. 7B

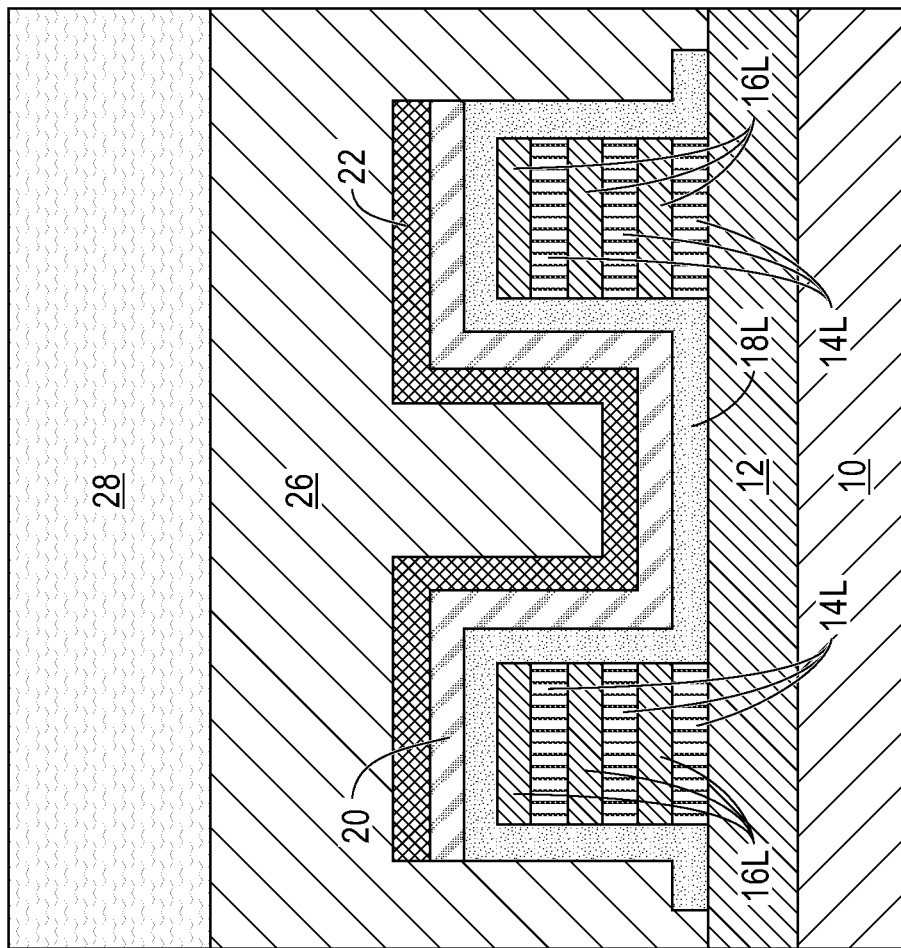
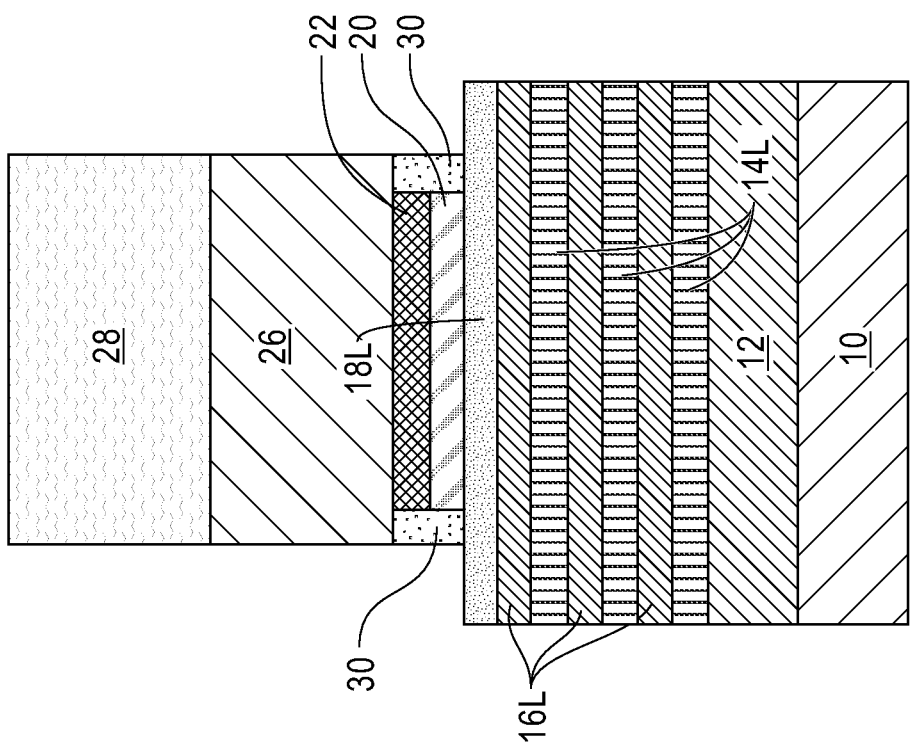
FIG. 9B
FIG. 9A

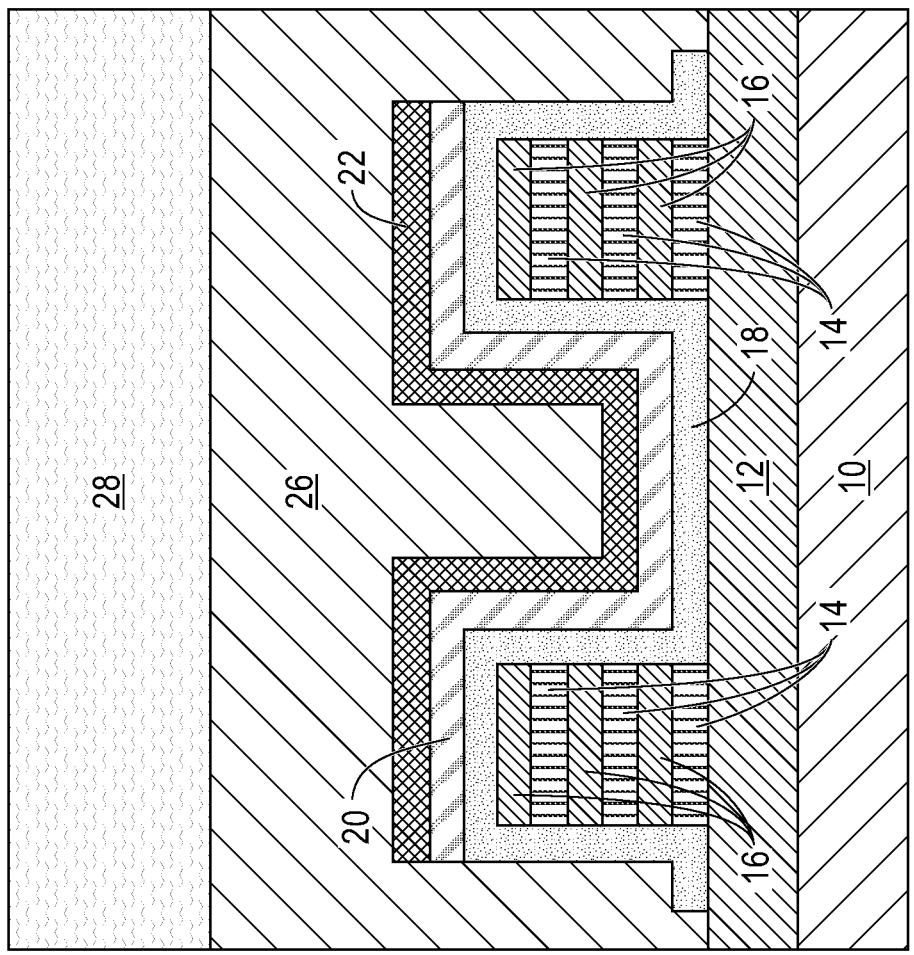
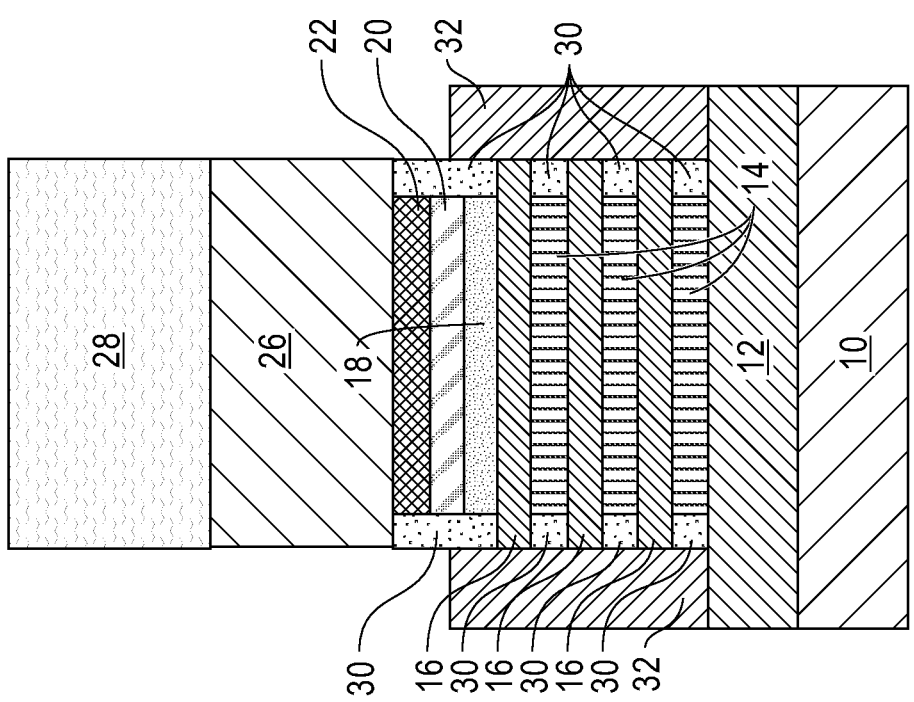
FIG. 10A
FIG. 10B

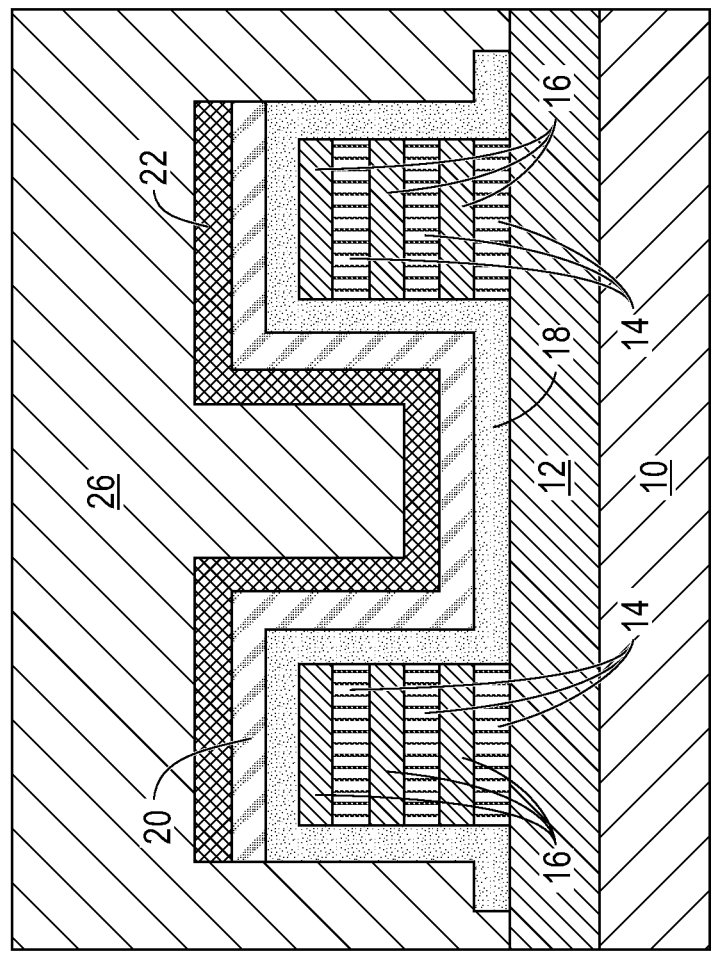
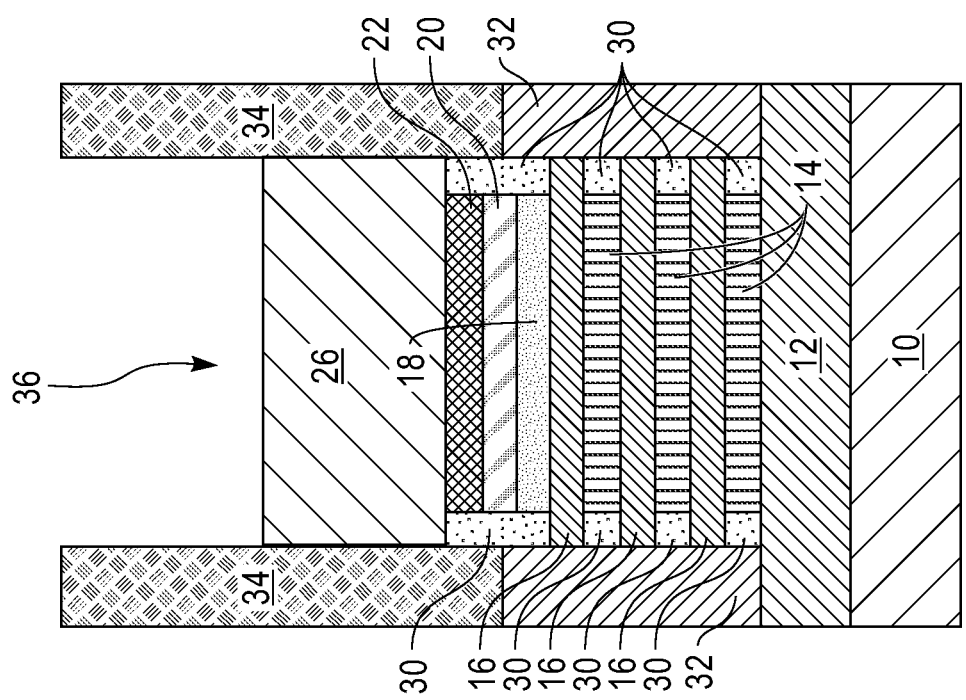
FIG. 12A
FIG. 12B

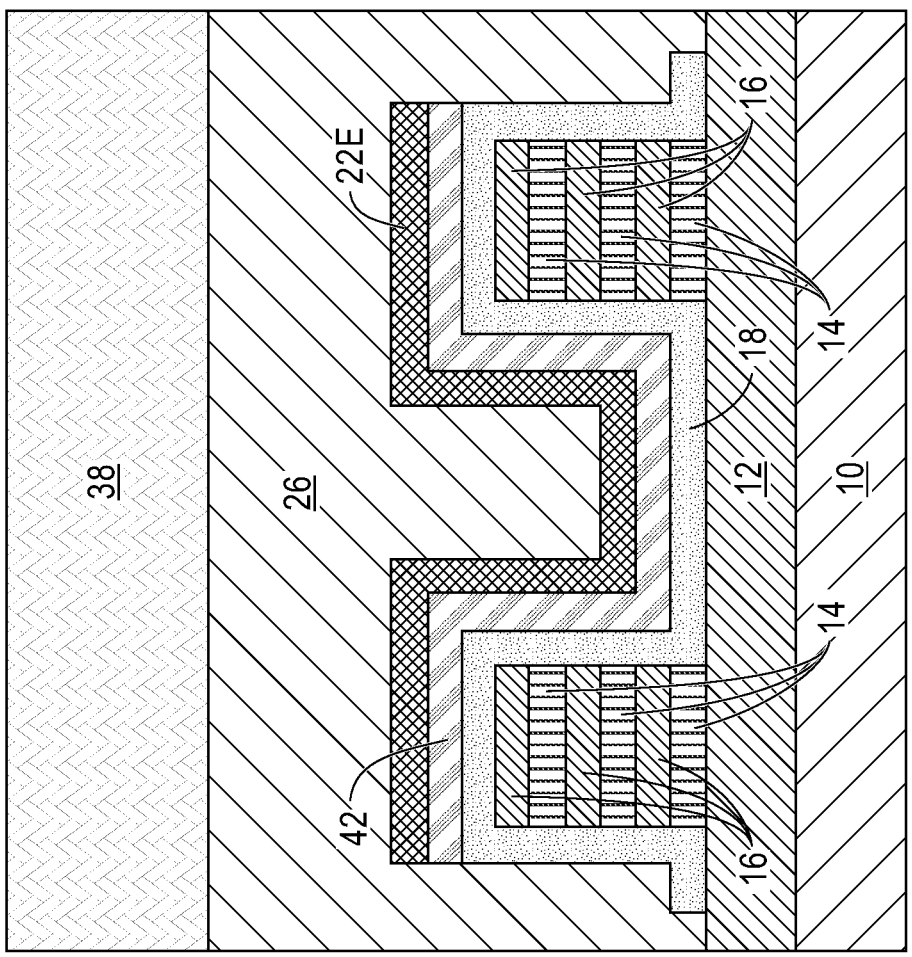
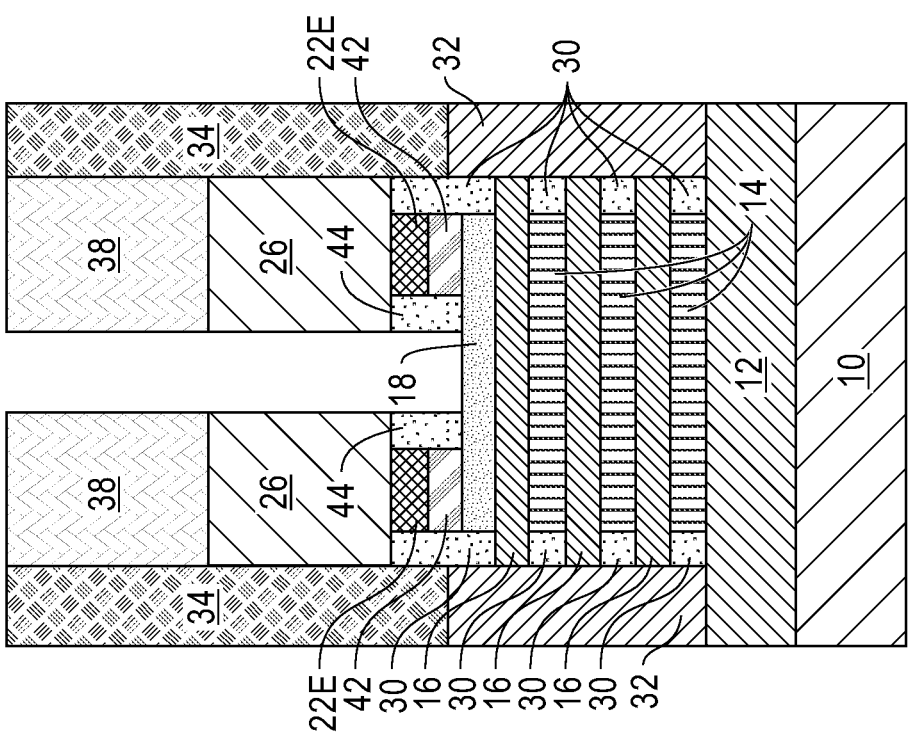
FIG. 15B
FIG. 15A

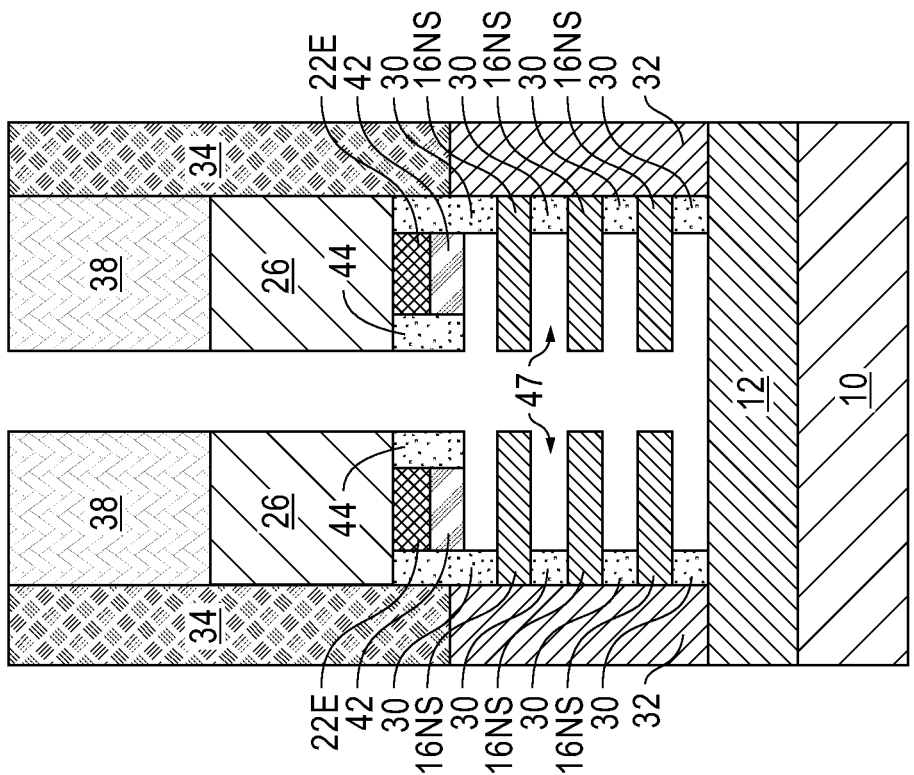
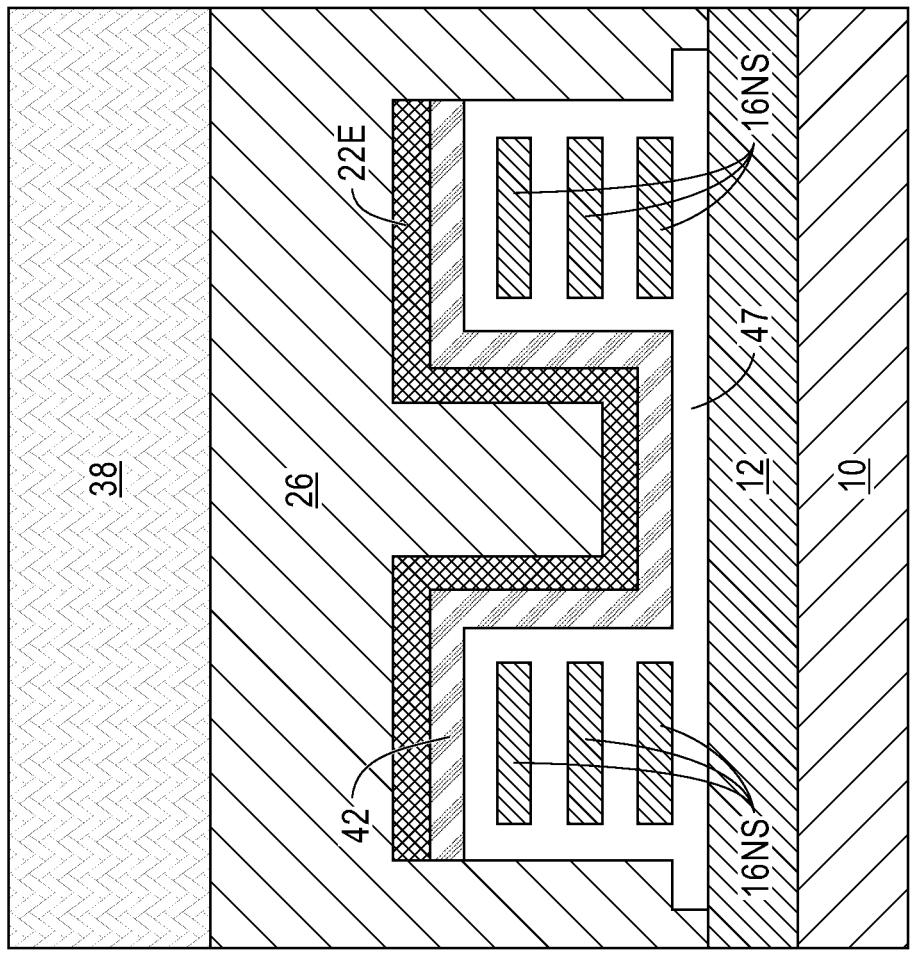
FIG. 17A
FIG. 17B

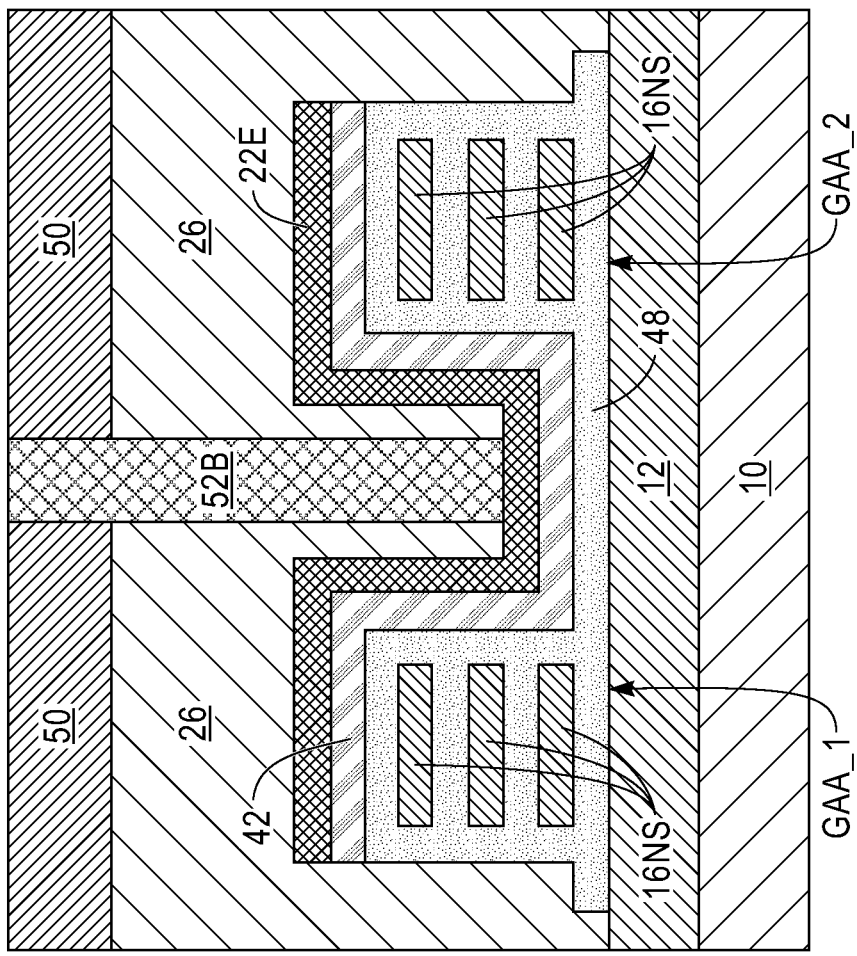
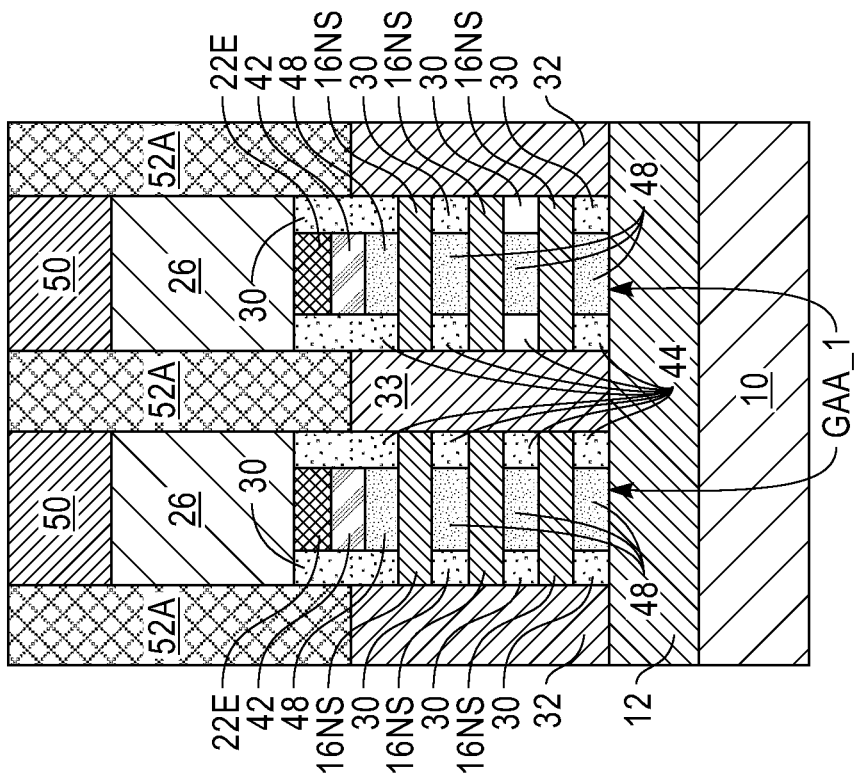
FIG. 20B
FIG. 20A

US 12,557,341 B2

NEGATIVE CAPACITANCE GATE-ALL-AROUND TRANSISTOR WITH TUNABLE CAPACITANCE RATIO

BACKGROUND

The present application relates to semiconductor technology, and more particularly to a semiconductor structure that includes a first gate-all-around (GAA) transistor and a second GAA transistor which contain a tunable and shared non-conductive layer as part of a gate stack.

GAA nanosheet field effect transistors (FETs) are the most promising candidates to replace FinFETs and nanowire (NW) FETs in future technology nodes owing to their improved short-channel effects, high current drivability per layout footprint, and extreme scalability. The much-needed voltage scaling in these aggressively scaled devices can be provided by introducing negative capacitance effect, which results in sub-60 mV/decade switching behavior.

SUMMARY

A semiconductor structure is provided that includes a tunable and shared non-conductive layer as part of a gate stack of at least a pair of nanosheet GAA transistors with a shared metal gate electrode. The present application further discloses a tunable non-conductive material/gate dielectric area ratio where the non-conductive material is not constrained to a periphery of the nanosheet stack cross section. Throughout the present application, the non-conductive layer or non-conductive material includes a ferroelectric material, an antiferroelectric material or combinations thereof.

In one aspect of the present application, a semiconductor structure is provided. In one embodiment, the semiconductor structure includes a first GAA transistor located in a first active area and a second GAA transistor located in a second active area. The first GAA transistor and the second GAA transistor include a shared gate structure in series with a shared non-conductive layer. The semiconductor structure further includes a metal electrode contacting the shared non-conductive layer, wherein the metal electrode has a same width as the shared non-conductive layer. The semiconductor structure further includes a gate contact structure contacting the metal electrode.

BRIEF DESCRIPTION OF THE DRAWINGS

FIG. 1 is a top-down view of an exemplary semiconductor device layout that can be employed in accordance with an embodiment of the present application, the semiconductor device layout includes a plurality of active areas oriented along a first direction, and a plurality of functional gate structures that are oriented in a second direction which is perpendicular to the first direction; in the drawing cut A-A, and cut B-B are shown.

FIGS. 2A and 2B are cross sectional views of an exemplary semiconductor structure corresponding to cuts A-A and B-B shown in FIG. 1, respectively, that can be employed in the present application, the semiconductor structure includes a semiconductor substrate, an insulator layer, and a patterned material stack including alternating sacrificial semiconductor material layers and semiconductor channel material layers.

FIGS. 7A and 7B are cross sectional views of the exemplary semiconductor structure shown in FIGS. 5A and 5B, respectively, after forming a dielectric layer and a hard mask layer.

FIGS. 9A and 9B are cross sectional views of the exemplary semiconductor structure shown in FIGS. 8A and 8B, respectively, after lateral etching of the patterned sacrificial dielectric liner and the patterned conductive metal liner and forming a first inner spacer.

FIGS. 10A and 10B are cross sectional views of the exemplary semiconductor structure shown in FIGS. 9A and 9B, respectively, after forming precursor nanosheet stacks of alternating precursor sacrificial semiconductor material nanosheets and precursor semiconductor channel material nanosheets, wherein during precursor nanosheet stack formation the conformal layer of sacrificial semiconductor material is patterned, laterally etching the patterned conformal layer of sacrificial semiconductor material and the precursor sacrificial semiconductor material nanosheets of each precursor nanosheet stack, forming additional first inner spacers and forming first source/drain regions.

FIGS. 12A and 12B are cross sectional views of the exemplary semiconductor structure shown in FIGS. 11A and 11B, respectively, after removing the patterned hard mask layer to reveal the patterned dielectric layer.

FIGS. 15A and 15B are cross sectional views of the exemplary semiconductor structure shown in FIGS. 14A and 14B, respectively, after forming a non-conductive layer, laterally etching the non-conductive layer and the metal electrode, and forming a second inner spacer.

FIGS. 17A and 17B are cross sectional views of the exemplary semiconductor structure shown in FIGS. 16A and 16B, respectively, after removing each sacrificial semiconductor material nanosheet and the patterned sacrificial semiconductor material layer.

FIGS. 20A and 20B are cross sectional views of the exemplary semiconductor structure shown in FIGS. 19A and 19B, respectively, after forming a second ILD layer, S/D contact structures, and gate contact structures.

DETAILED DESCRIPTION

Figure 3B:
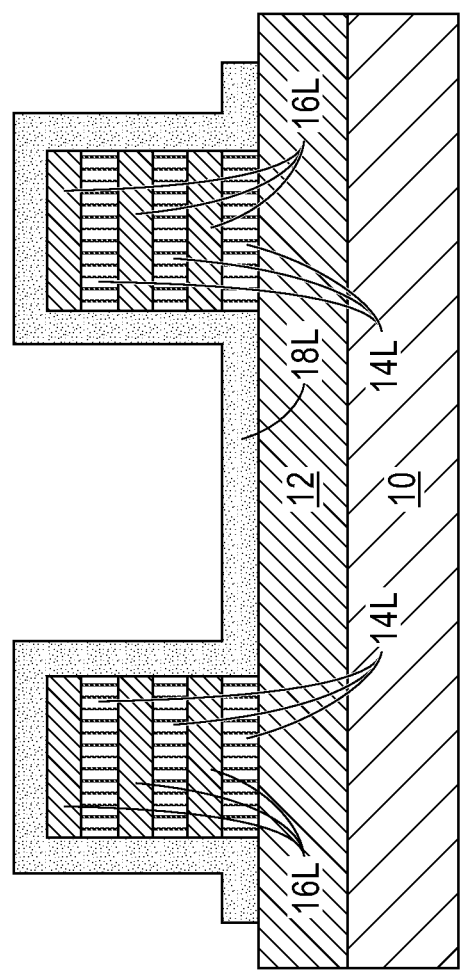
FIGS. 3A and 3B are cross sectional views of the exemplary semiconductor structure shown in FIGS. 2A and 2B, respectively, after forming a conformal layer of sacrificial semiconductor material on top, and along sidewalls, of each patterned material stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Negative capacitance FETs require adequate capacitance matching between the ferroelectric and series gate dielectric within the gate stack. Depending on the negative capacitance of the ferroelectric, it may be necessary to build a transistor with a ferroelectric/gate dielectric area ratio of less than 1 as a practical approach to capacitance matching. In principle, this can be achieved in a metal-ferroelectric-metal insulator semiconductor (MFMIS) configuration with the ferroelectric constrained to the gate contact via; however varying the ferroelectric/gate dielectric area ratio in this context requires a range of gate contact patterning solutions. Preferably, it is desired to enable a ferroelectric/gate dielectric area ratio variation without any impact to the device geometry.

The disclosed semiconductor structure of the present application has a tunable and shared non-conductive layer (i.e., ferroelectric and/or antiferroelectric) as part of the gate stack of at least a pair of nanosheet GAA transistors with a shared metal gate electrode. The disclosed semiconductor structure has a tunable non-conductive material/gate dielectric area ratio where the non-conductive material is not constrained to a periphery of the nanosheet stack cross section (e.g., it can be located over an isolation region). In the present application, a GAA transistor is a transistor that includes at least one, preferably a plurality of, semiconductor channel material nanosheet(s) in which a gate structure (including a gate dielectric layer and a gate electrode) is formed wrapping around each semiconductor channel material nanosheet. The GAA transistor will include a source/drain region located on each side of the gate structure.

In one embodiment, and as is shown in FIGS. 20A-23, a semiconductor structure is provided that includes a first GAA transistor, GAA_1, located in a first active area and a second GAA transistor, GAA_2, located in a second active area. GAA_1 and GAA_2 include shared gate structure 48 in series with a shared non-conductive layer 42. The term "in series" denotes a plurality of components (in this case the gate structure 48 and the shared non-conductive layer 42) which are electrically in series with each other. The semiconductor structure further includes metal electrode 22E contacting shared non-conductive layer 42, wherein the metal electrode 33E has a same width as the shared non-conductive layer 42. The semiconductor structure further includes gate contact structure 52B contacting the metal electrode 22E. Such a semiconductor structure has a tunable and shared non-conductive layer as part of the gate stack of at least a pair of nanosheet GAA transistors with a shared metal gate electrode (present in the shared gate structure).

In some embodiments, and as is illustrated in FIG. 20B, shared non-conductive layer 42 entirely covers the shared gate structure 48 located above an uppermost semiconductor channel material nanosheet (i.e., topmost semiconductor channel material nanosheet 16NS illustrated in FIG. 20B) of GAA_1, and entirely covers the shared gate structure 48 located above an uppermost semiconductor channel material nanosheet (i.e., topmost semiconductor channel material nanosheet 16NS illustrated in FIG. 20B) of GAA_2. In such embodiments and as illustrated in FIG. 20B, the shared non-conductive layer 42 covers an entirety of the shared gate structure 48 that is present between the first active area and the second active area. In such embodiments, the semiconductor structure has a non-conductive material to gate dielectric area ratio that less than 1. Such a semiconductor structure has a tunable and shared non-conductive layer as part of the gate stack of at least a pair of nanosheet GAA transistors with a shared metal gate electrode (present in the shared gate structure).

Figure 21:
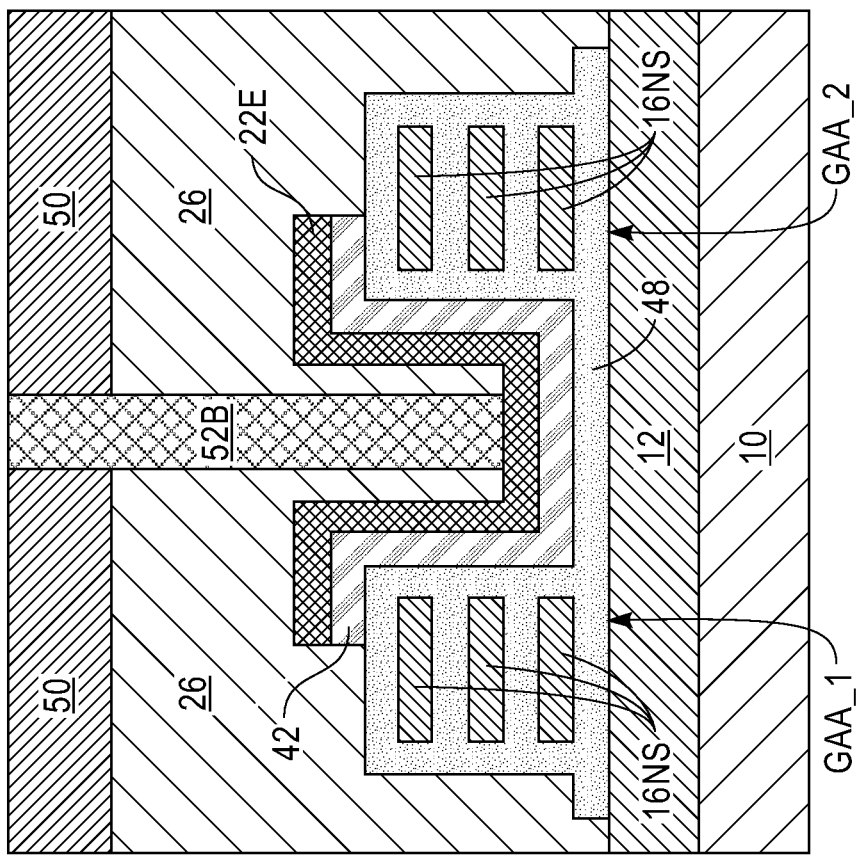

In some embodiments, and as is illustrated in FIG. 21, shared non-conductive layer 42 partially covers the shared gate structure 48 that is located above an uppermost semiconductor channel material nanosheet (i.e., topmost semiconductor channel material nanosheet 16NS illustrated in FIG. 21) of GAA_1, and partially covers the shared gate structure 48 that is located above an uppermost semiconductor channel material nanosheet (i.e., topmost semiconductor channel material nanosheet 16NS illustrated in FIG. 21) of GAA_2. In such embodiments and as illustrated in FIG. 21, the shared non-conductive layer 42 covers an entirety of the shared gate structure 48 that is present between the first active area and the second active area. In such embodiments, the semiconductor structure has a non-conductive material to gate dielectric area ratio that is less than 1 and smaller than that of FIG. 20B. Such a semiconductor structure has a tunable and shared non-conductive layer as part of the gate stack of at least a pair of nanosheet GAA transistors with a shared metal gate electrode (present in the shared gate structure).

Figure 22:
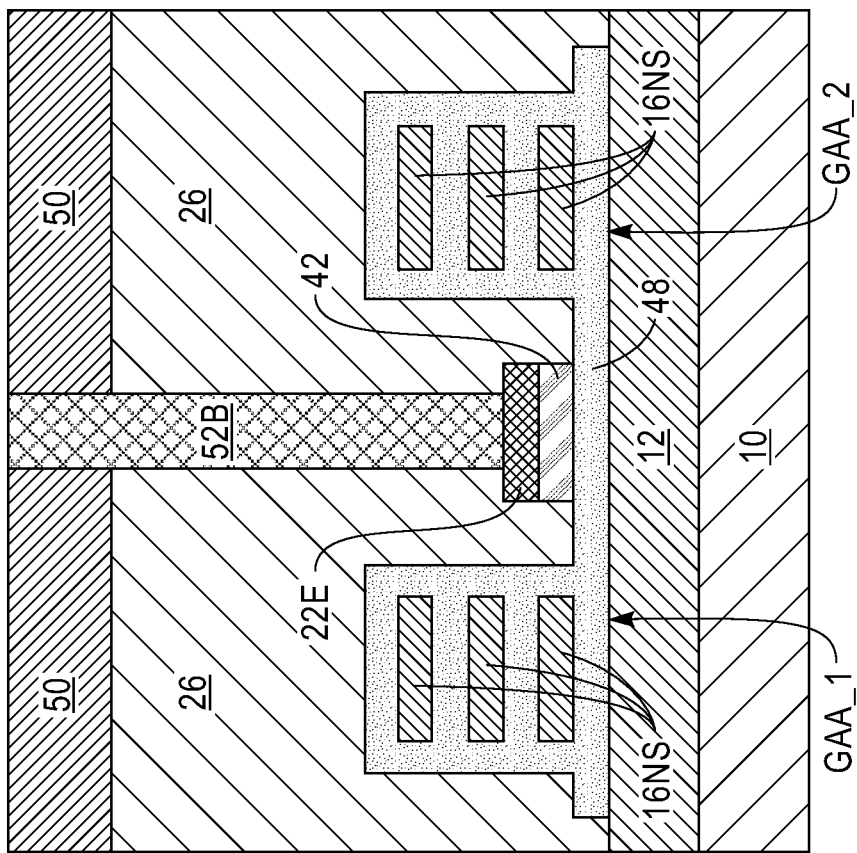
FIGS. 21-23 are cross sectional views through cut B-B showing alternative exemplary semiconductor structure of the present application.

In some embodiments, and as is illustrated in FIG. 22, shared non-conductive layer 42 is located entirely in an area between the first active area and the second active area and is spaced apart from inner facing sidewalls of the shared gate structure 48 of both GAA_1 and GAA_2. In such embodiments, the shared non-conductive layer 42 is not present above, or along sidewalls of, the semiconductor material nanosheets 16NS that are present in the first active area including GAA_1 and the second active area including GAA_2. In such embodiments, the shared non-conductive layer 42 is limited to the area that is located between these two active areas. In such embodiments, the semiconductor structure has a non-conductive material to gate dielectric area ratio that is less than 1 and smaller than that of FIG. 21. Such a semiconductor structure has a tunable and shared non-conductive layer as part of the gate stack of at least a pair of nanosheet GAA transistors with a shared metal gate electrode (present in the shared gate structure).

Figure 23:
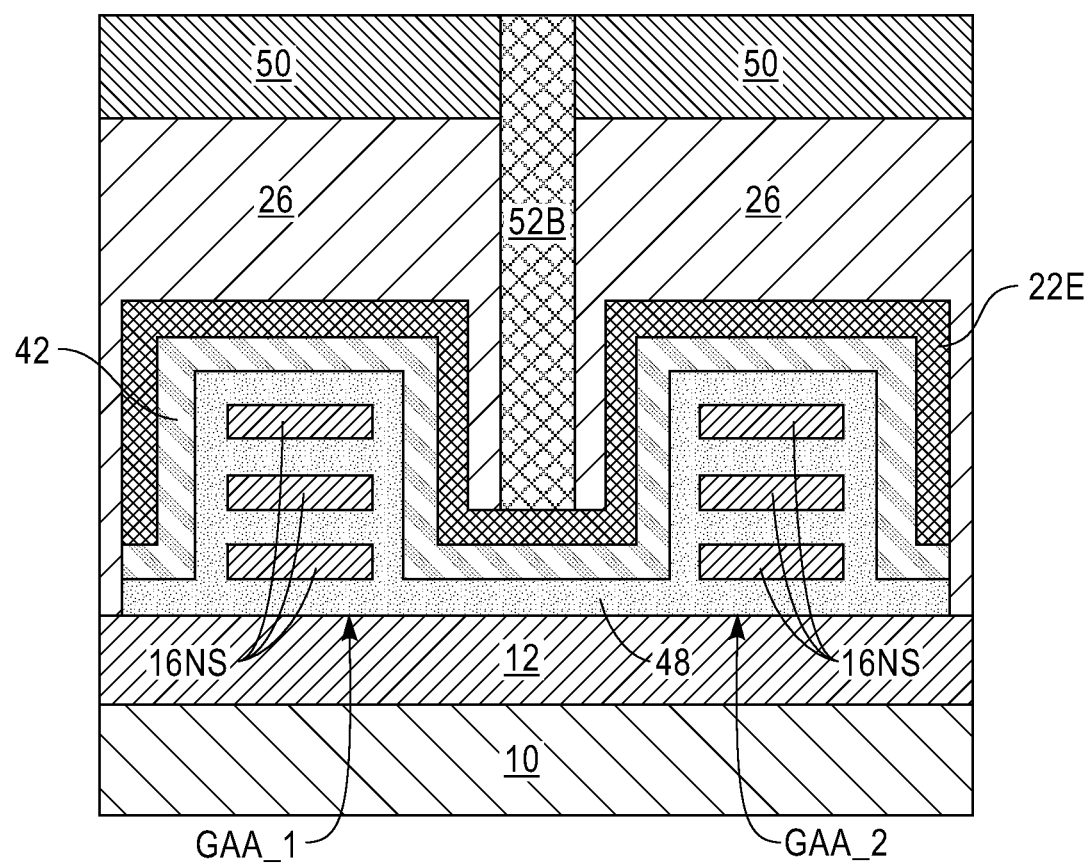

In some embodiments, and as is illustrated in FIG. 23, shared non-conductive layer 42 extends an entire width of the shared gate structure 48. In such embodiments, the structure has a non-conductive material to gate dielectric area ratio that is at a maximum. Such a semiconductor structure has a tunable and shared non-conductive layer as part of the gate stack of at least a pair of nanosheet GAA transistors with a shared metal gate electrode (present in the shared gate structure).

In some embodiments, shared non-conductive layer 42 is a ferroelectric material, an antiferroelectric material, or a combination thereof.

In some embodiments, and as is illustrated in FIGS. 20B-23, GAA_1 and GAA_2 are located on a surface of insulator layer 12 that is located on a semiconductor substrate 10. The insulator layer 12 provides electrical isolation to the two GAA transistors. In such embodiments, the shared gate structure 48 that is located between the first active area and the second active area is capacitively coupled to, and directly above, the insulator layer 12.

In some embodiments, the insulator layer 12 can be omitted and the two GAA transistors are formed on the semiconductor substrate 10. Although not shown, such an embodiment can be readily understood from FIGS. 20B-23 by simply omitting the insulator layer 12. In such embodiments, GAA_1 and GAA_2 are located on a surface of the semiconductor substrate 10. In such embodiments, the shared gate structure 48 that is located between the first active area and the second active area is capacitively coupled to, and directly above, the semiconductor substrate 10. In such embodiments, the capacitive coupling of the shared gate structure 48 to the semiconductor substrate 10 is stronger as compared to embodiments in which the insulator layer 12 is present.

In some embodiments, and as illustrated in FIGS. 20B-23, gate contact structure 52B which contacts the metal electrode 22E is located in an area between the first active area and the second active area. In some embodiments (not shown, but readily discernable from FIGS. 20B-23), the gate contact structure 52B which contacts the metal electrode 22E is located on top of one of the active areas.

In some embodiments, GAA_1 is of a different conductivity type than GAA_2. Thus GAA_1 can be a p-type GAA transistor, and GAA_2 can be an n-type GAA transistor, or GAA_1 can be an n-type GAA transistor, and GAA_2 can be a p-type GAA transistor.

In some embodiments, GAA_1 and GAA_2 include source/drain regions (see, for example, FIG. 20A in which two GAA transistors are shown and each GAA transistor includes a pair of source/drain regions, i.e., first source/drain region 32 and second source/drain region 33). In some embodiments, one of the source/drain regions is composed of a semiconductor material and a dopant, and the other source/drain region is a metallic source/drain region. In yet other embodiments, both source/drain regions are composed of a semiconductor material and a dopant. In yet other embodiments, both source/drain regions are metallic source/drain regions (i.e., source/drain regions that are composed of a metal).

In some embodiments, the semiconductor structure further includes source/drain contact structure 52A that contacts the source/drain regions (i.e., first source/drain region 32, and second source/drain region 33).

In some embodiments, GAA_1 and GAA_2 include a plurality of vertically stacked semiconductor channel material nanosheets 16NS. In such embodiments, shared gate structure 48 is present above and along sidewalls of the plurality of vertically stacked semiconductor channel material nanosheets 16NS of GAA_1, and the above and along sidewalls of the plurality of vertically stacked semiconductor channel material nanosheets 16NS of GAA_2.

Referring first to FIG. 1, there is illustrated an exemplary semiconductor device layout that can be employed in accordance with an embodiment of the present application. The exemplified semiconductor device layout includes a plurality of active areas, AA1 and AA2, oriented along a first direction, and a plurality of functional gate structures, e.g., GS1 and GS2, that are oriented in a second direction which is perpendicular to the first direction; in the drawing cut A-A, and cut B-B are shown. Cut A-A is through a length-wise direction of one of the active areas, e.g., AA1, and through each of GS1 and GS2, and cut B-B is through a length-wise direction of one of the gate structures, e.g., GS2, and through two active areas, AA1 and AA2. In the present application, AA1 is an area in which GAA FETs of a first conductivity type are formed, while AA2 is an area in which GAA FETs of a second conductivity type, which is different from the first conductivity type, are formed.

Referring now to FIGS. 2A and 2B, there are illustrated an exemplary semiconductor structure corresponding to cuts A-A and B-B shown in FIG. 1, respectively, that can be employed in the present application. The semiconductor structure includes a semiconductor substrate 10, an insulator layer 12, and a patterned material stack including alternating sacrificial semiconductor material layers 14L and semiconductor channel material layers 16L. At least one patterned material stack is present in each active device region, i.e., AA1 and AA2 shown in FIG. 1 above. In some embodiments, insulator layer 12 can be omitted from the exemplary structure shown in FIGS. 2A and 2B.

The semiconductor substrate 10 is composed of a first semiconductor material. The term "semiconductor material" is used throughout the present application to denote a material having semiconducting properties. Examples of semiconductor materials that can be used in the present application in providing the semiconductor substrate 10 include, but are not limited to, silicon (Si), a silicon germanium (SiGe) alloy, a silicon germanium carbide (SiGeC) alloy, germanium (Ge), III/V compound semiconductors or II/VI compound semiconductors. In one example, the semiconductor substrate 10 is composed of Si.

The insulator layer 12 of the exemplary semiconductor structure illustrated in FIGS. 2A-2B can be composed of a dielectric material such as, for example, silicon dioxide and/or boron nitride. As mentioned above, insulator layer 12 can be omitted in some embodiments of the present application.

Each patterned material stack includes alternating sacrificial semiconductor material layers 14L and semiconductor channel material layers 16L. In some embodiments and as is illustrated in FIGS. 2A-2B, there is an equal number of sacrificial semiconductor material layers 14L and semiconductor channel material layers 16L. That is, each patterned material stack can include 'n' number of sacrificial semiconductor material layers 14L and 'n' number of semiconductor channel material layers 16L, wherein n is an integer starting from one. By way of one example, each patterned material stack includes three sacrificial semiconductor material layers 14L and first semiconductor channel material layers 16L. In some embodiments (not shown), there are n+1 sacrificial semiconductor material layers 14L and 'n' number of semiconductor channel material layers 16L.

Each sacrificial semiconductor material layer 14L is composed of a second semiconductor material, while each semiconductor channel material layer 16L is composed of a third semiconductor material that is compositionally different from the second semiconductor material. The second semiconductor material that provides each sacrificial semiconductor material layer 14L, and the third semiconductor material that provides each semiconductor channel material layer 16L can include one of the semiconductor materials mentioned above for the semiconductor substrate 10. In one example, each sacrificial semiconductor material layer 14L is composed of a silicon germanium alloy having a germanium content from 20 atomic percent to 40 atomic percent, and each semiconductor channel material layer 16L is composed of silicon. Other combinations of semiconductor materials are possible as long as the second semiconductor material is compositionally different from the third semiconductor material. In some embodiments, the third semiconductor material that provides each semiconductor channel material layer 16L can provide high channel mobility for n-type field effect transistor (FET) devices. In other embodiments, the third semiconductor material that provides each semiconductor channel material layer 16L can provide high channel mobility for p-type FET devices.

Each sacrificial semiconductor material layer 14L can have a first thickness, and each semiconductor channel material layer 16L can have a second thickness. In the present application, the first thickness can be equal to, greater than, or less than, the second thickness. The sacrificial semiconductor material layers 14L and the semiconductor channel material layers 16L have equal widths and lengths at this point of the process of the present application.

The exemplary semiconductor structure shown in FIGS. 2A-2B can be formed utilizing techniques well known to those skilled in the art. In one example, the exemplary semiconductor structure shown in FIGS. 2A-2B can be formed by depositing the insulator layer 12 on the semiconductor substrate 10, depositing a first material stack of the alternating sacrificial semiconductor material layers 14L and semiconductor channel material layers 16L on the insulator layer 12, and then patterning the as-deposited material stack. The deposition of the insulator layer 12 can include chemical vapor deposition (CVD), plasma enhanced chemical vapor deposition (PECVD), atomic layer deposition (ALD) or physical vapor deposition (PVD). The deposition of the material stack can include CVD, PECVD or epitaxial growth. Throughout the present application, the terms "epitaxial growth" or "epitaxially growing" mean the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

Patterning can include lithography and etching (dry etching and/or chemical wet etching). Dry etching can include, for example, reactive ion etching (RIE), ion beam etching (IBE), and plasma etching. Chemical wet etching includes the use of an appropriate chemical etchant that has a high etch rate for one material as compared to at least one another material.

Figure 3A:
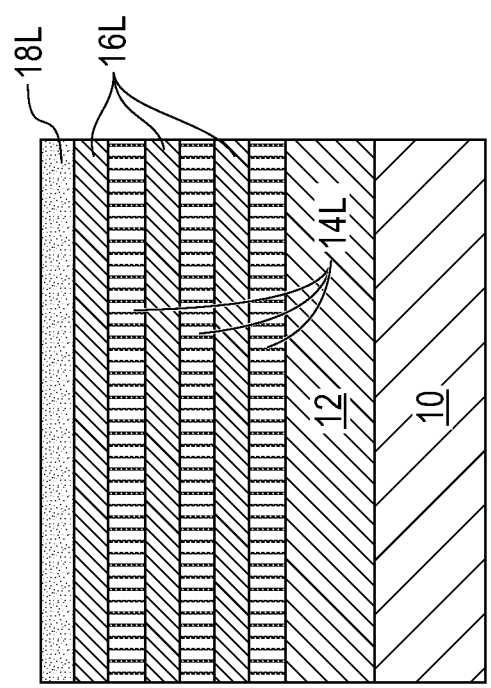

Referring now to FIGS. 3A and 3B, there are illustrated the exemplary semiconductor structure shown in FIGS. 2A and 2B, respectively, after forming a conformal layer of sacrificial semiconductor material 18L on top, and along sidewalls, of each patterned material stack. Notably, the conformal layer of sacrificial semiconductor material 18L is formed on a topmost surface of an uppermost semiconductor channel material layer 16L of each patterned material stack as well as along the sidewall of each patterned material stack. The term "conformal layer" is used throughout the present application to denote a material layer whose thickness measured upward from a horizontal surface of another material layer is the same as the thickness of the material layer as measured outward from a vertical surface of the another material layer.

The conformal layer of sacrificial semiconductor material 18L is compositionally the same as each sacrificial semiconductor material layer 14L. As is shown in FIG. 3B, the conformal layer of sacrificial semiconductor material 18L is present on a surface of the insulator layer 12 and the conformal layer of sacrificial semiconductor material 18L continuously extends between the two patterned material stacks. The conformal layer of sacrificial semiconductor material 18L can be formed by a conformal deposition process such as, for example, CVD, PECVD or ALD, followed by a patterning process which trims edges of the conformal layer of sacrificial semiconductor material 18L.

Figure 4B:
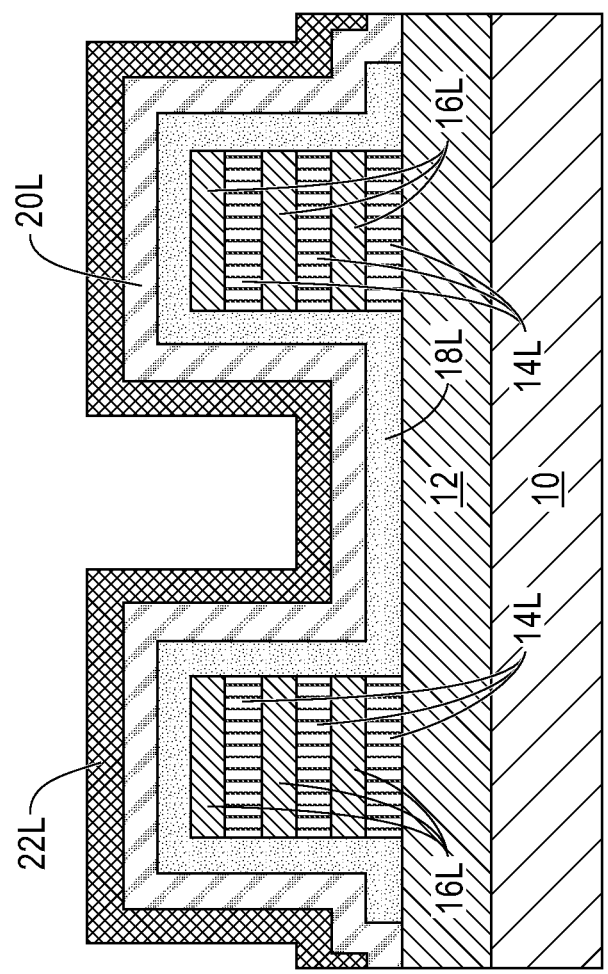
FIGS. 4A and 4B are cross sectional views of the exemplary semiconductor structure shown in FIGS. 3A and 3B, respectively, after forming a sacrificial dielectric layer and a conductive metal layer.
Figure 4A:
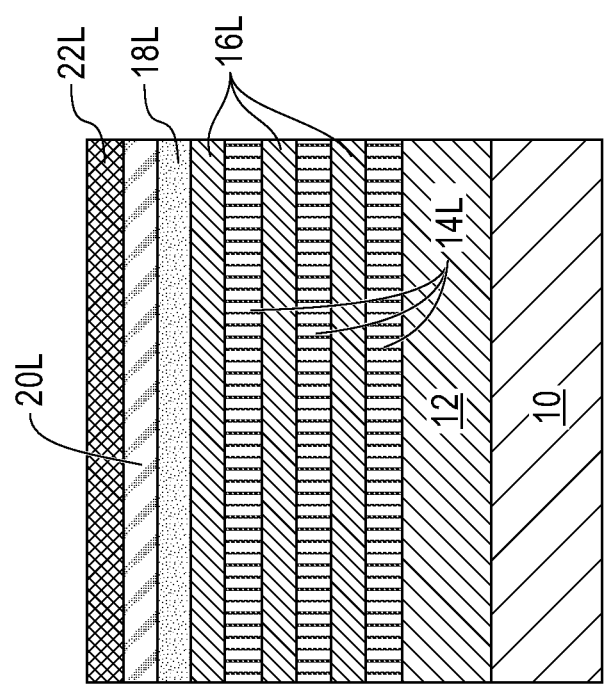

Referring now to FIGS. 4A and 4B, there are illustrated the exemplary semiconductor structure shown in FIGS. 3A and 3B, respectively, after forming a sacrificial dielectric layer 20L and a conductive metal layer 22L. The sacrificial dielectric layer 20L is formed on a surface of the conformal layer of sacrificial semiconductor material 18L and an exposed portion of the insulator layer 12. The conductive metal layer 22L is formed on the sacrificial dielectric layer 20L. The sacrificial dielectric layer 20L and/or the conductive metal layer 22L can also be a conformal layer; however a conformal layer is not required for the sacrificial dielectric layer 20L and/or the conductive metal layer 22L.

The sacrificial dielectric layer 20L is a composed of a sacrificial dielectric material such as, but not limited to, $AlO_x$ and $TiO_x$. The sacrificial dielectric layer 20L can be formed utilizing a deposition process such as, for example, CVD, PECVD, ALD, or PVD.

The conductive metal layer 22L is composed of any conductive electrode material including, but not limited to, Ti, TaN, TaN, TiN, Cu, Co, W or WN. The conductive metal layer 22L can be formed utilizing a deposition process such as, for example, CVD, PECVD, ALD, PVD, plating or sputtering.

Figure 5B:
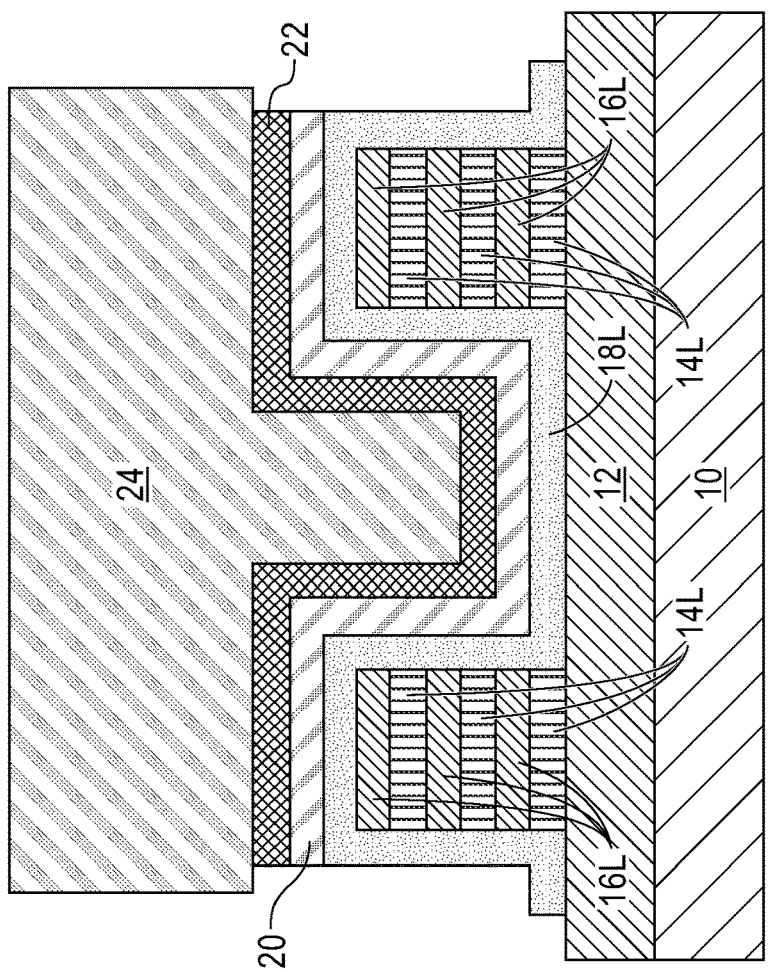
FIGS. 5A and 5B are cross sectional views of the exemplary semiconductor structure shown in FIGS. 4A and 4B, respectively, after gate cut patterning which cuts the sacrificial dielectric layer into a sacrificial dielectric liner and the conductive metal layer into a conductive metal liner.
Figure 5A:
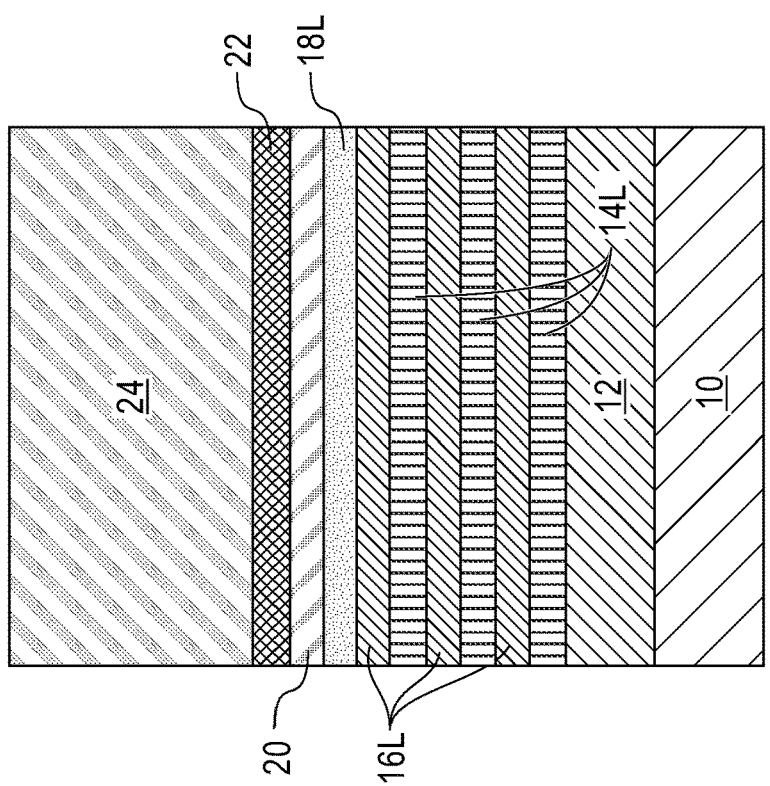
Figure 6A:
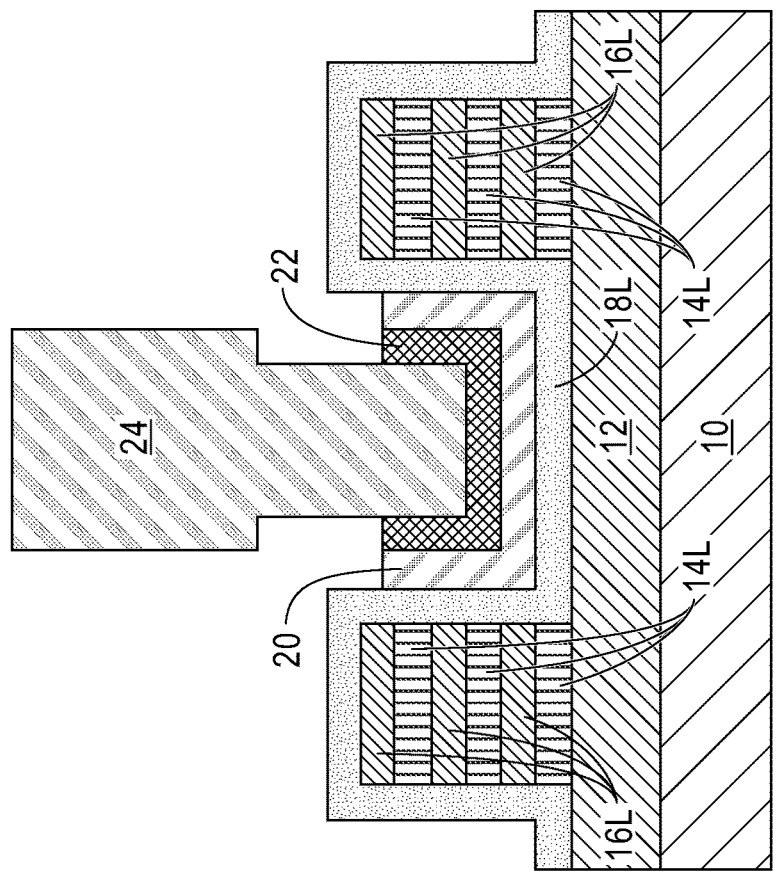
FIGS. 6A-6B are cross sectional views illustrating two alternative exemplary semiconductor structures that can be formed after gate cut patterning.
Figure 6B:
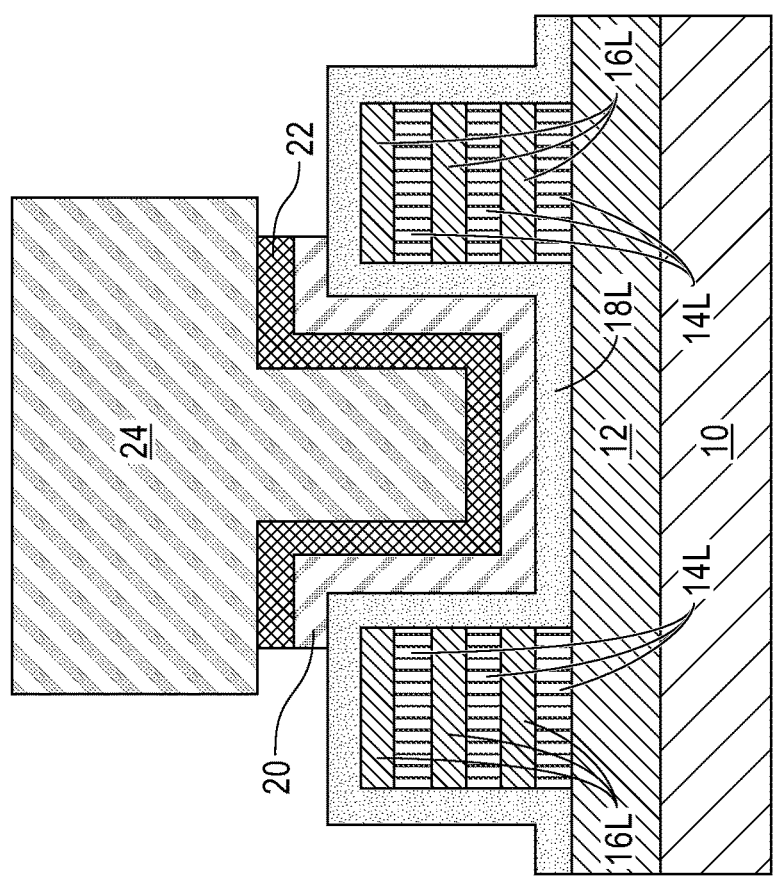

Referring now to FIGS. 5A and 5B, there are illustrated the exemplary semiconductor structure shown in FIGS. 4A and 4B, respectively, after gate cut patterning. Gate cut patterning cuts the sacrificial dielectric layer 20L and the conductive metal layer 22L as shown in FIG. 5B. FIGS. 6A-6B shows two alternative structures that can be formed after gate cut patterning. The sacrificial dielectric layer 20L that remains after the gate cut patterning can now be referred to a sacrificial dielectric liner 20, while the conductive metal layer 22L that remains after the gate cut patterning can now be referred to a conductive metal liner 22.

Gate cut patterning includes forming a patterned organic planarization layer (OPL) 24 on the exemplary structure shown in FIGS. 4A-4B. The patterned OPL 24 can be formed by deposition of an OPL material, followed by lithography and etching. Following the formation of the patterned OPL 24, the sacrificial dielectric layer 20L and the conductive metal layer 22L not protected by the patterned OPL 24 are removed by a gate cut etch. Following the gate cut etch, a lateral etch can be employed to remove portions of the sacrificial dielectric layer 20L and portions of the conductive metal layer 22L that are located directly beneath the patterned OPL 24. This step of the present application can provide a structure in which the area of the sacrificial liner/conductive liner coverage is controlled as is shown in FIGS. 5B, 6A and 6B. Notably. FIG. 5B shows an embodiment in which the sacrificial dielectric liner 20 and the conductive metal liner 22 cover an entirety of a topmost surface of each patterned material stack. Conductive metal liner 22 subsequently provides the metal gate electrode of each GAA transistor. FIG. 6A shows an embodiment in which the sacrificial dielectric liner 20 and the conductive liner 20 partially cover a topmost surface of each patterned material stack, and FIG. 6B shows an embodiment in which the sacrificial dielectric liner 20 and the conductive metal liner 22 are not on a topmost surface of each patterned material stack. After gate cut patterning, the patterned OPL 24 is removed from the exemplary structure utilizing a conventional material removal process that is selective in removing the OPL material.

Referring now to FIGS. 7A and 7B, there are illustrated the exemplary semiconductor structure shown in FIGS. 5A and 5B, respectively, after forming a dielectric layer 26 and a hard mask layer 28. It is noted that although the process of the present application continues with the structure shown in FIGS. 5A and 5B, the process of the present application can continue with the exemplary structure shown in FIG. 6A or the exemplary structure shown in FIG. 6B. Dielectric layer 26 is composed of a dielectric material that is compositionally different from the dielectric material that provides the sacrificial dielectric layer 20L mentioned above. Illustrative examples of dielectric materials that can be used in providing the dielectric layer 26 include, but are not limited to, silicon dioxide, silicon nitride, silicon oxynitride, SiOCN, SiBCN, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). The dielectric layer 26 can be formed by a deposition process including, but not limited to, CVD, PECVD or spin-on coating.

The hard mask layer 28 is composed of a hard mask dielectric material; the hard mask dielectric material is compositionally different from the dielectric materials that provide the dielectric layer 26 and the sacrificial dielectric layer 20L. In one example, the dielectric hard material that provides the hard mask layer 28 is composed of silicon dioxide and/or silicon nitride. The hard mask layer 28 can be formed by a deposition process including, but not limited to, CVD, PECVD, or PVD. Following the deposition of the hard mask material, a planarization process such as, for example, chemical mechanical polishing (CMP), can be employed.

Figure 8B:
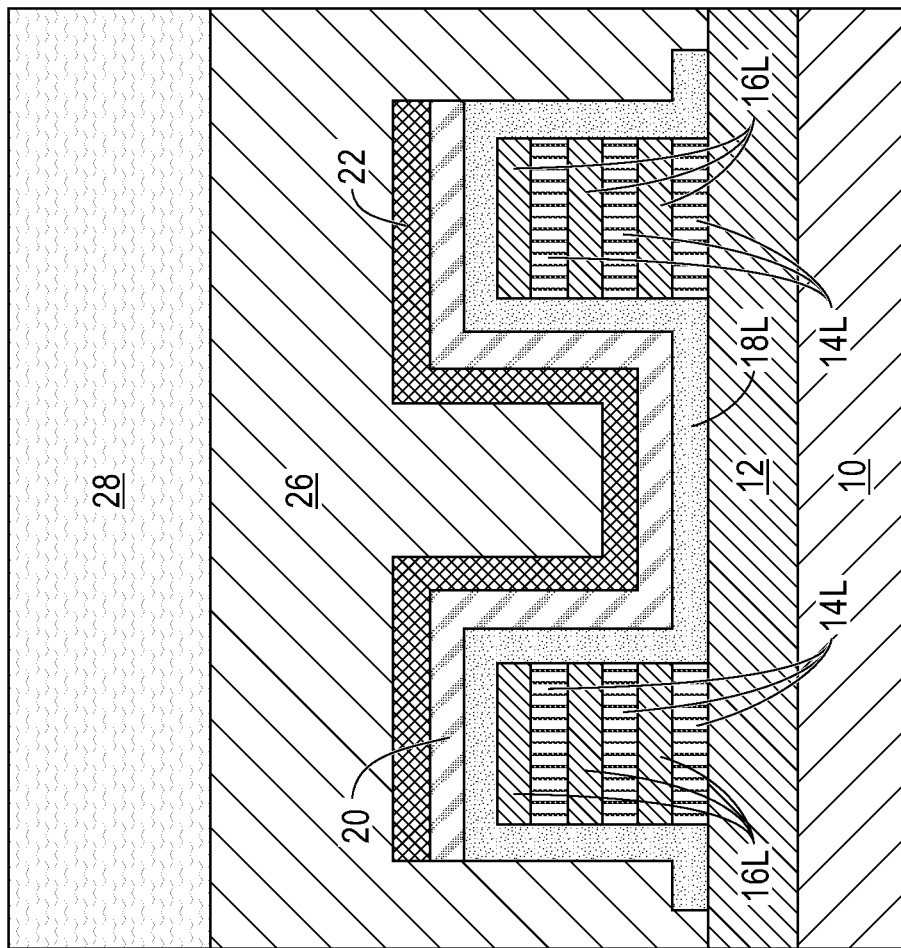
FIGS. 8A and 8B are cross sectional views of the exemplary semiconductor structure shown in FIGS. 7A and 7B, respectively, after first gate patterning, wherein the first gate patterning includes patterning the hard mask layer, the dielectric layer, the conductive metal liner and the sacrificial dielectric liner.
Figure 8A:
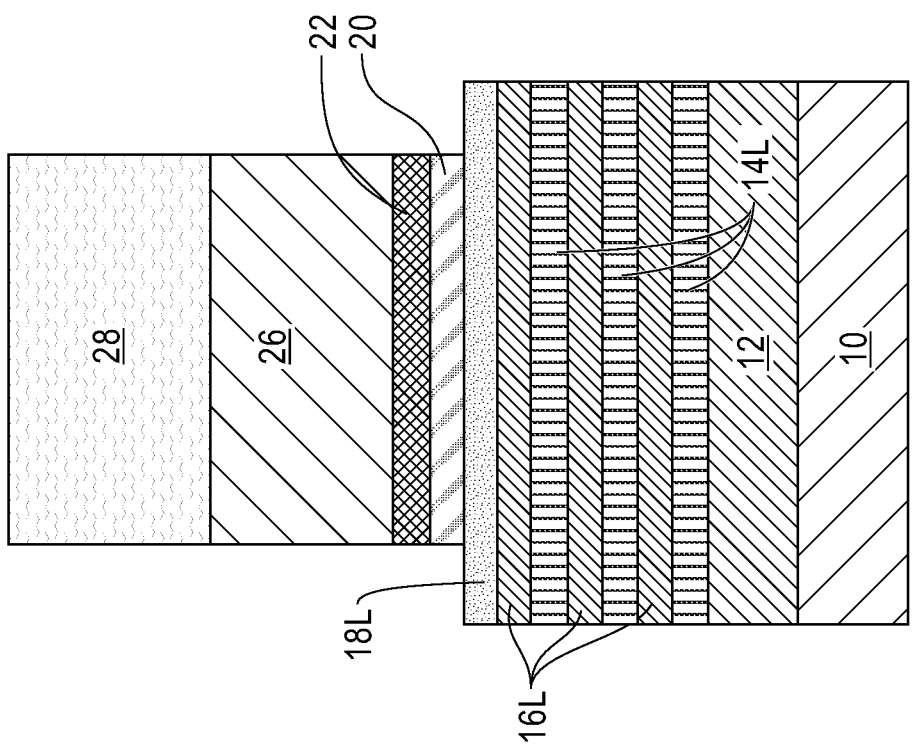

Referring now to FIGS. 8A and 8B, there are illustrated the exemplary semiconductor structure shown in FIGS. 7A and 7B, respectively, after first gate patterning, wherein the first gate patterning includes patterning the hard mask layer 28, the dielectric layer 26, the conductive metal liner 22 and the sacrificial dielectric liner 20. First gate patterning includes lithography and etching. In the illustrated embodiment, first gate patterning is fat gate patterning. By "fat gate patterning" it is meant the patterning process provides a gate mask that has an extended length which is subsequently used in providing a precursor nanosheet stack that has the extended length. The term "precursor nanosheet stack" is used throughout the present application to denote an initial nanosheet stack that will be subsequently split in half to provide two nanosheet stacks that have a desired length that is less than the extended length provided by the fat gate patterning. That is, the illustrated step describes an embodiment in which a long gate length is provided by the fat gate patterning step, which is later split into two smaller gate lengths with a gap therebetween. At this point of the present application, each of the patterned hard mask layer 28, the patterned dielectric layer 26, the patterned conductive metal liner 22 and the patterned sacrificial dielectric liner 20 has a sidewall that is vertically aligned with other.

Referring now to FIGS. 9A and 9B, there are illustrated the exemplary semiconductor structure shown in FIGS. 8A and 8B, respectively, after lateral etching of the patterned sacrificial dielectric liner 20 and the patterned conductive metal liner 22 and forming a first inner spacer 30. The laterally etching removes end portions of the patterned sacrificial dielectric liner 20 and the patterned conductive metal liner 22 to form an indentation beneath the patterned hard mask layer 28 and patterned dielectric layer 26. The indentations are then filled with a dielectric spacer material to form first inner spacers 30 as shown in FIG. 9A. The dielectric spacer material that provides the first inner spacers 30 includes, for example, silicon dioxide, SiN, SiBCN, SiOCN or SiOC. The first inner spacers 30 can be formed by deposition of the dielectric spacer material, followed by a spacer etch.

Referring now to FIGS. 10A and 10B, there are illustrated the exemplary semiconductor structure shown in FIGS. 9A and 9B, respectively, after forming precursor nanosheet stacks of alternating precursor sacrificial semiconductor material nanosheets 14 and precursor semiconductor channel material nanosheets 16, wherein during precursor nanosheet stack formation the conformal layer of sacrificial semiconductor layer is patterned (a patterned sacrificial semiconductor layer 18 is formed), laterally etching the precursor sacrificial semiconductor material nanosheets 14 of each precursor nanosheet stack and the patterned sacrificial semiconductor layer 18, forming additional first inner spacers (the additional first spacers are also labeled as element 30 in the drawings of the present application) and forming first source/drain regions 32.

Precursor nanosheet formation includes an etch, such as, for example, RIE, in which at least the patterned hard mask layer 28, first inner spacers 30, and the patterned dielectric layer 26 are used as a combined gate mask. The etch removes portions of the conformal layer of sacrificial semiconductor material 18L, portions of each semiconductor channel material layer 16L and portions of each sacrificial semiconductor material layer 14L that are not protected by the combined etch mask. Precursor nanosheets of alternating precursor sacrificial semiconductor material nanosheets 14 (i.e., remaining non-etched portions of the sacrificial semiconductor material layer 14L that is present beneath the combined etch mask) and precursor semiconductor channel material nanosheets 16 (i.e., remaining non-etched portions of the semiconductor channel material layer 16L that is present beneath the combined etch mask) are formed by this etch. It is noted that the precursor sacrificial semiconductor nanosheets 14 and the precursor semiconductor channel material nanosheets 16 have the extended length because of the fat gate patterning process mentioned above. On top of and along each sidewall of each precursor nanosheet stack there is present a remaining non-etched portion of the conformal layer of sacrificial semiconductor material 18L (i.e., patterned sacrificial semiconductor layer 18).

After precursor nanosheet formation, the patterned sacrificial semiconductor layer 18 and the precursor sacrificial semiconductor material nanosheets 14 of each precursor nanosheet stack are laterally etched to indent the patterned sacrificial semiconductor layer 18 and each precursor sacrificial semiconductor material nanosheet 14. Additional first inner spacers (i.e., additional first inner spacers 30) are formed within each indentation. In the present, the topmost first inner spacer 30 that is present along the sidewalls of each of the laterally etched patterned sacrificial semiconductor layer 18, the patterned sacrificial dielectric liner 20, and the patterned conductive metal liner 22 has a height that is greater than the remaining first inner spacers 30 since the uppermost first inner spacer 30 is a combination of the previously formed first inner spacer and an additional first inner spacer. The additional first inner spacers are composed of one of the gate dielectric spacer materials mentioned above for first inner spacer 30. The additional first inner spacers are formed by deposition of the gate dielectric spacer material, followed by a spacer etch.

In some embodiments, first source/drain regions 32 are then formed by an epitaxial growth process, as defined above. The first source/drain regions 32 extend outward from a sidewall of each precursor semiconductor channel material nanosheet 16. Each first source/drain region 32 is composed of a fourth semiconductor material and a dopant. As used herein, a "source/drain" region can be a source region or a drain region depending on subsequent wiring and application of voltages during operation of the transistor. The fourth semiconductor material that provides each first source/drain region 32 is composed of one of the semiconductor materials as mentioned above for semiconductor substrate 10. The fourth semiconductor material that provides the first source/drain regions 32 can be compositionally the same as, or compositionally different from, the third semiconductor material that provides each precursor semiconductor channel material nanosheet 16. The fourth semiconductor material that provides each first source/drain region 32 is however compositionally different from the second semiconductor material that provides each precursor sacrificial semiconductor material nanosheet 14 and as well the patterned sacrificial semiconductor layer 18. The dopant that is present in the first source/drain regions 32 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each first source/drain region 32 can have a dopant concentration of from $4 \times 10^{20}$ atoms/cm$^3$ to $3 \times 10^{21}$ atoms/cm$^3$. Although first source/drain regions 32 are typically composed of a semiconductor material and a dopant, it is possible to form metallic source/drain regions instead. The metallic source/drain regions are described in greater detail in reference to the second source/drain region 33 that will be subsequently formed.

Figure 11B:
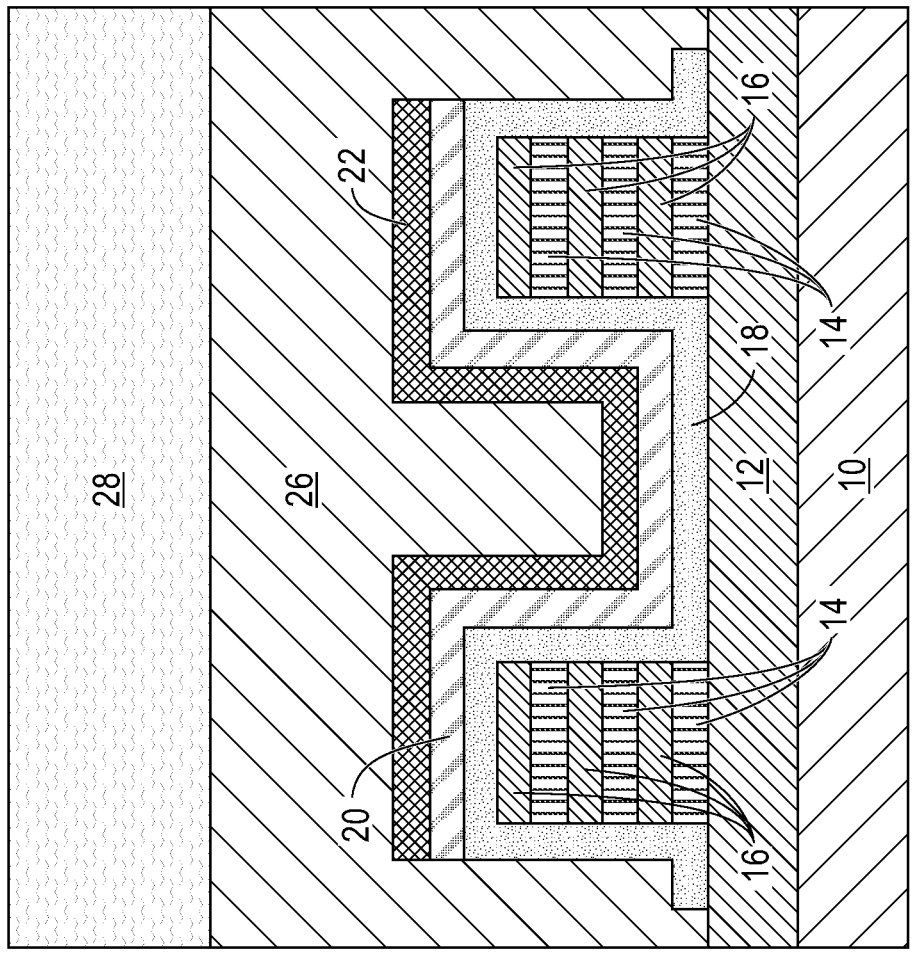
FIGS. 11A and 11B are cross sectional views of the exemplary semiconductor structure shown in FIGS. 10A and 10B, respectively, after forming a first interlayer dielectric (ILD) layer.
Figure 11A:
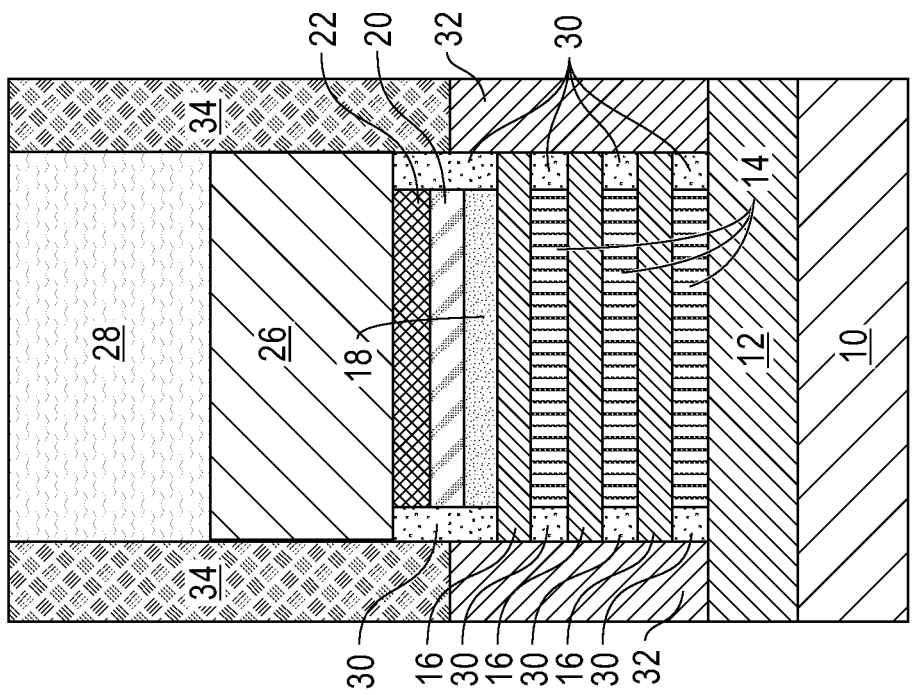

Referring now to FIGS. 11A and 11B, there are illustrated the exemplary semiconductor structure shown in FIGS. 10A and 10B, respectively, after forming a first ILD layer 34. First ILD layer 34 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The first ILD layer 34 can be formed by a deposition process including, but not limited to, CVD, PECVD or spin-on coating. A planarization process such as, for example, CMP follows the deposition process.

Referring now to FIGS. 12A and 12B, there are illustrated the exemplary semiconductor structure shown in FIGS. 11A and 11B, respectively, after removing the patterned hard mask layer 28 layer to provide opening 36 that reveals dielectric layer 26 The removal of patterned hard mask layer 28 includes a material removal process that is selective in removing the hard mask material that provides the patterned hard mask layer 28.

Figure 13B:
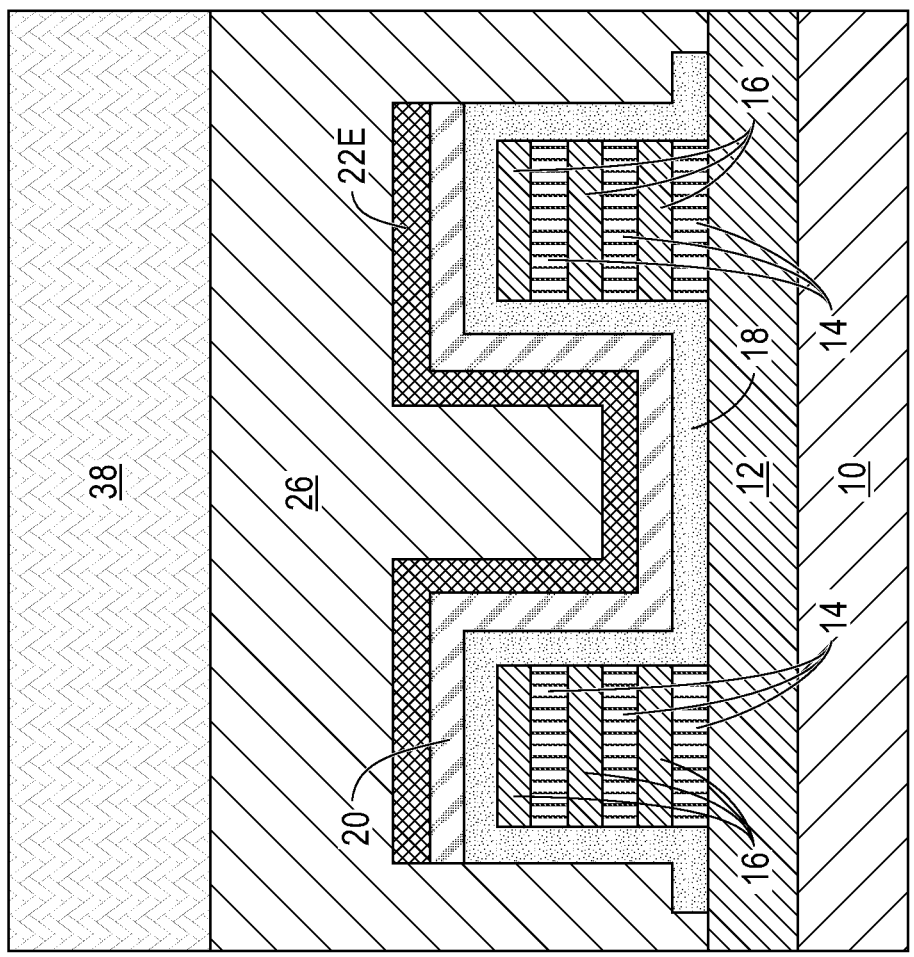
FIGS. 13A and 13B are cross sectional views of the exemplary semiconductor structure shown in FIGS. 12A and 12B, respectively, after forming a dielectric spacer, and second gate patterning of the previously patterned sacrificial dielectric liner and the previously patterned conductive metal liner; the second gate patterning converts the previously patterned conductive metal liner into a metal electrode.
Figure 13A:
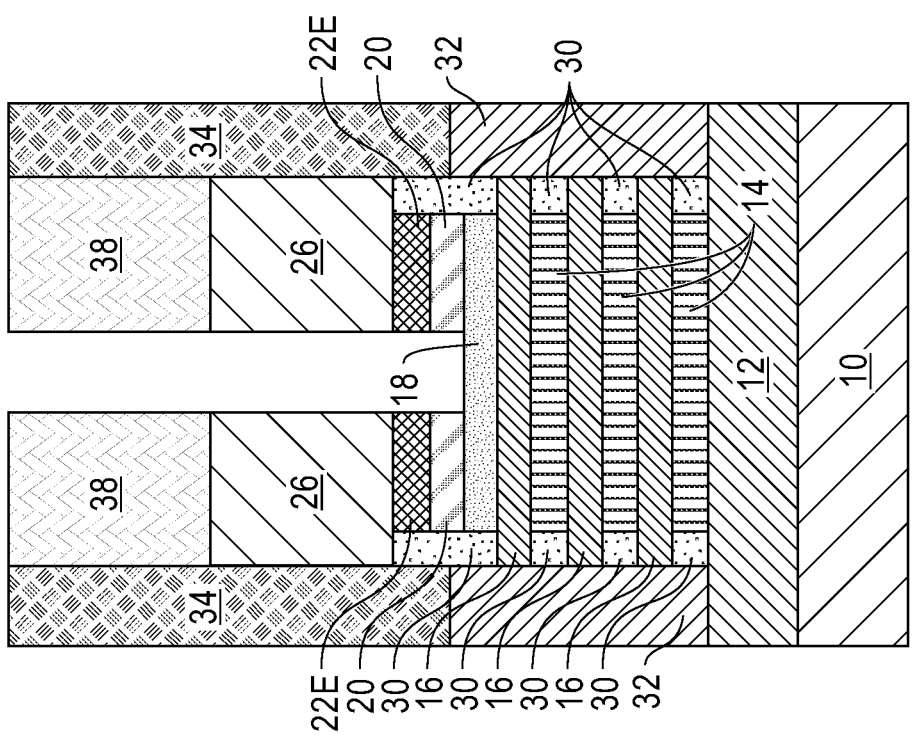

Referring now to FIGS. 13A and 13B, there are illustrated the exemplary semiconductor structure shown in FIGS. 12A and 12B, respectively, after forming a dielectric spacer 38, and second gate patterning of the patterned dielectric liner and patterned conductive metal liner 22. The second gate patterning converts the previously patterned conductive metal liner into a metal electrode 22E. The dielectric spacer 38 is formed inside the opening 36 and it is composed of one of the dielectric spacer materials mentioned above for the first inner spacer 30. The dielectric spacer 38 is formed by deposition of the dielectric spacer material, followed by a spacer etch. In some embodiments, a planarization process can be performed between deposition and spacer etch. With the dielectric spacer 38 in place, portions of dielectric layer 26, patterned conductive metal liner 22 and the patterned sacrificial dielectric liner 20 that are not protected by the dielectric spacer 38 are removed utilizing one or more etching processes. The one or more etching processes stop on an upper surface of the patterned sacrificial semiconductor layer 18.

Figure 14B:
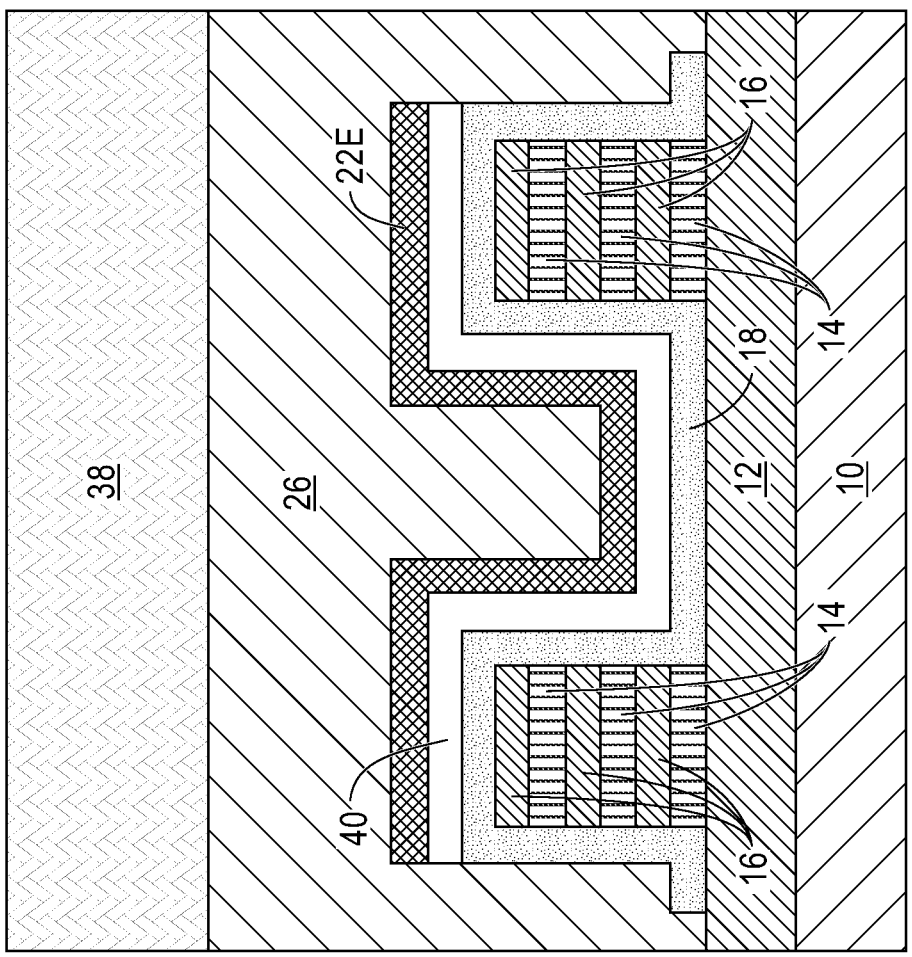
FIGS. 14A and 14B are cross sectional views of the exemplary semiconductor structure shown in FIGS. 13A and 13B, respectively, after removing the previously patterned sacrificial dielectric liner to reveal the patterned sacrificial semiconductor material.
Figure 14A:
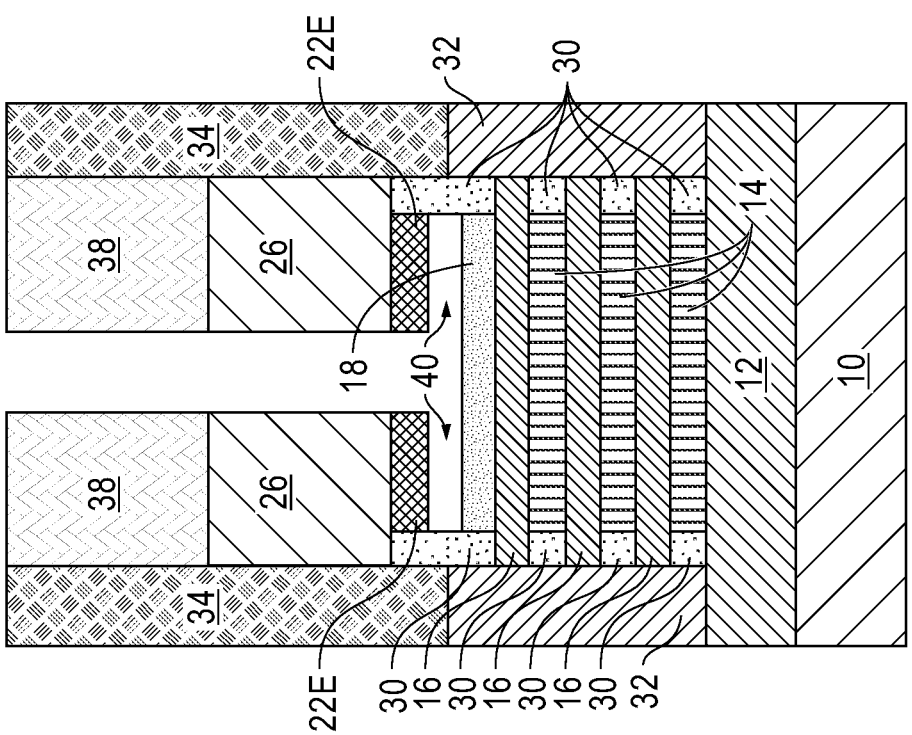

Referring now to FIGS. 14A and 14B, there are illustrated the exemplary semiconductor structure shown in FIGS. 13A and 13B, respectively, after removing the patterned sacrificial dielectric liner 20 to reveal the patterned sacrificial semiconductor layer 18. The removal of the patterned sacrificial dielectric liner 20 includes a material removal process that is selective in removing the dielectric material that provides the patterned sacrificial dielectric liner 20. The removal of the patterned sacrificial dielectric liner 20 forms a gap 40 between the metal electrode 22E and the patterned sacrificial semiconductor layer 18.

Referring now to FIGS. 15A and 15B, there are illustrated the exemplary semiconductor structure shown in FIGS. 14A and 14B, respectively, after forming a non-conductive layer 42, laterally etching the non-conductive layer 42 and the metal electrode 22E and forming a second inner spacer 44. The non-conductive layer 42 fills the gap 40 that is shown in FIGS. 14A and 14B.

The non-conductive layer 42 is composed of a ferroelectric material, an antiferroelectric material or a combination of a ferroelectric material and an antiferroelectric material. Ferroelectric materials are materials that exhibit ferroelectricity. Ferroelectricity is the ability of a material to have a spontaneous electric polarization. This polarization can be reversed by the application of an external electric field in the opposite direction. Illustrative examples of ferroelectric materials that can be used as the non-conductive layer 42 include, but are not limited to, $BaTiO_3$, $PbTiO_3$, lead zirconate titanate (PZT), and hafnium zirconium oxide (HZO). Antiferroelectric materials are materials that include an ordered (crystalline) array of electric dipoles (from ions and electrons in the material), but with adjacent dipoles oriented in opposite (antiparallel) directions. This contrasts with ferroelectric materials in which the dipoles of the material all point in a same direction. In an antiferroelectric, unlike ferroelectric, the total macroscopic spontaneous polarization is zero since the adjacent dipoles cancel each other out. Illustrative examples of antiferroelectric materials that can be used as the non-conductive layer 42 include, but are not limited to, $PbZrO_3$, $NaNbO_3$, and HZO.

The non-conductive layer 42 can be formed utilizing a deposition process such as, for example, CVD or PECVD. An etch can be used to remove any portion of the non-conductive layer 42 that is present outside of the gap 40.

The non-conductive layer 42 and the metal electrode 22E are then laterally etched, and a second inner spacer 44 is formed in the indentation formed by the lateral etch. The second inner spacer 44 is composed of one of the spacer dielectric materials mentioned above for the first inner spacer 30. The spacer dielectric material that provides the second inner spacer 44 can be compositionally the same as, or compositionally different from, the spacer dielectric material that provides the first inner spacer 30.

Figure 16B:
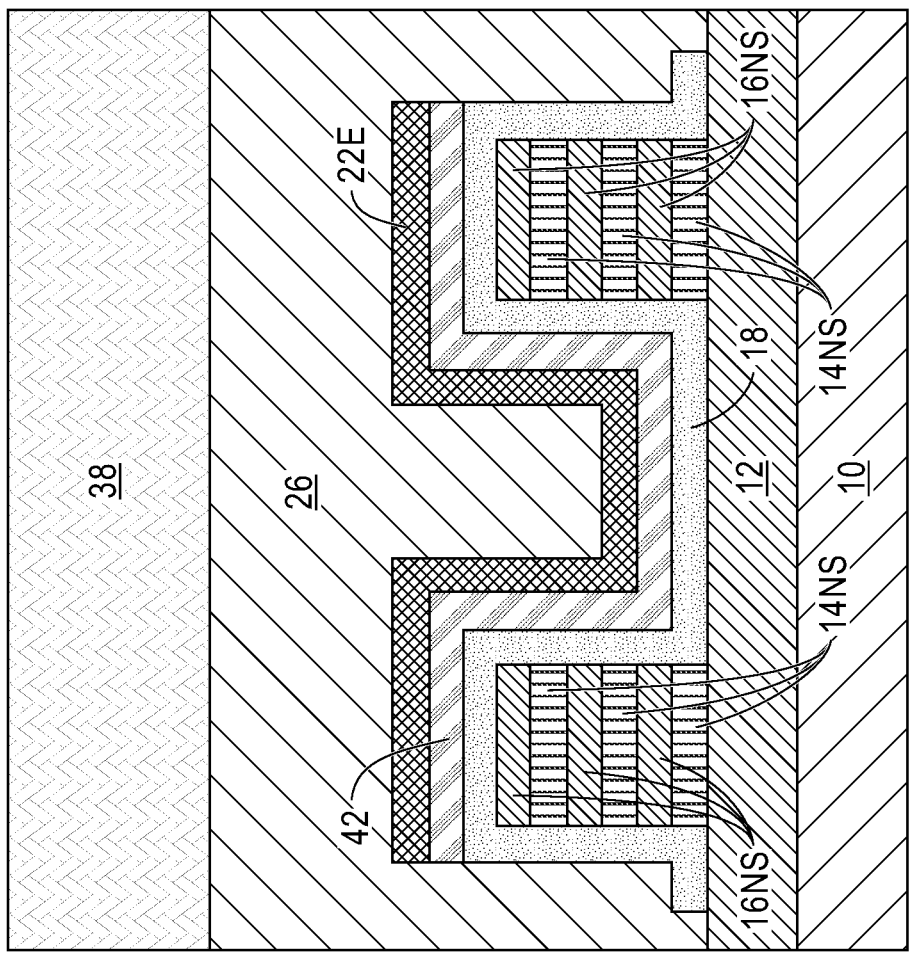
FIGS. 16A and 16B are cross sectional views of the exemplary semiconductor structure shown in FIGS. 15A and 15B, respectively, after etching each revealed precursor nanosheet stack to form two laterally adjacent nanosheet stacks, each nanosheet stack includes alternating sacrificial semiconductor material nanosheets and semiconductor channel material nanosheets.
Figure 16A:
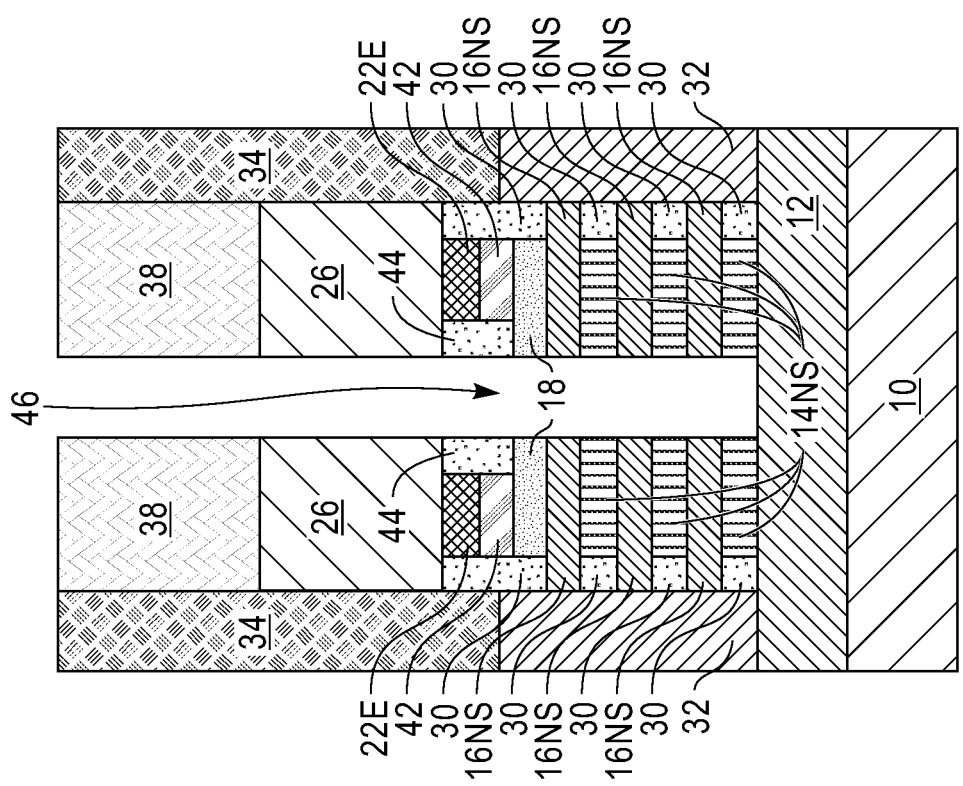

Referring now to FIGS. 16A and 16B, there are illustrated the exemplary semiconductor structure shown in FIGS. 15A and 15B, respectively, after etching each revealed precursor nanosheet stack to form two laterally adjacent nanosheet stacks (these two nanosheet stacks have a reduced length as compared to the precursor nanosheet stack that is patterned by this step of the present application; see for example, FIG. 16A). The pair of nanosheet stacks that are formed by splitting each precursor nanosheet stack includes non-etched portions of the precursor sacrificial semiconductor material nanosheets 14 (hereinafter referred to as sacrificial semiconductor material nanosheets 14NS) and non-etched portions of the precursor semiconductor channel material nanosheets 16 (hereinafter referred to as semiconductor channel material nanosheets 16NS). The sacrificial semiconductor material nanosheets 14NS and the semiconductor channel material nanosheets 16NS have a reduced length as compared to their precursor nanosheet counterparts; compare for example, FIG. 16A with FIG. 15A.

The etching uses the dielectric spacer 38 and dielectric layer 26 as a combined etch mask. Gap 46 is formed between the two nanosheet stacks that are formed by this etching step. In one embodiment, the etch is RIE. This etching process stop on a surface of the insulator layer 12 and reveals sidewalls of each semiconductor channel material nanosheets 16NS of the two laterally adjacent nanosheets stacks.

Referring now to FIGS. 17A and 17B, there are illustrated the exemplary semiconductor structure shown in FIGS. 16A and 16B, respectively, after removing each sacrificial semiconductor material nanosheet 14NS and the patterned sacrificial semiconductor layer 18. The removal of each sacrificial semiconductor material nanosheet 14NS and the patterned sacrificial semiconductor layer 18 includes a material removal process that is selective in removing both the each sacrificial semiconductor material nanosheet 14NS and the patterned sacrificial semiconductor layer 18. This step forms a gate cavity 47 in which a gate structure will be subsequently formed.

Figure 18B:
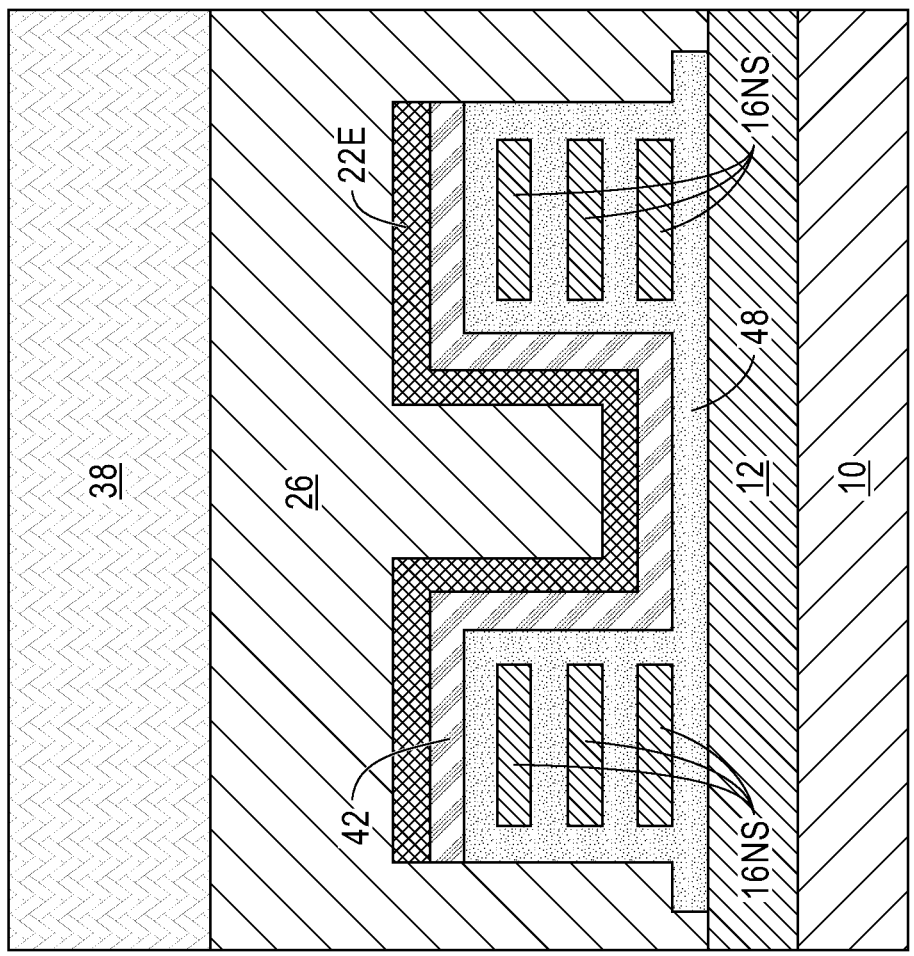
FIGS. 18A and 18B are cross sectional views of the exemplary semiconductor structure shown in FIGS. 17A and 17B, respectively, after forming a gate stack including a gate dielectric layer and a gate electrode.
Figure 18A:
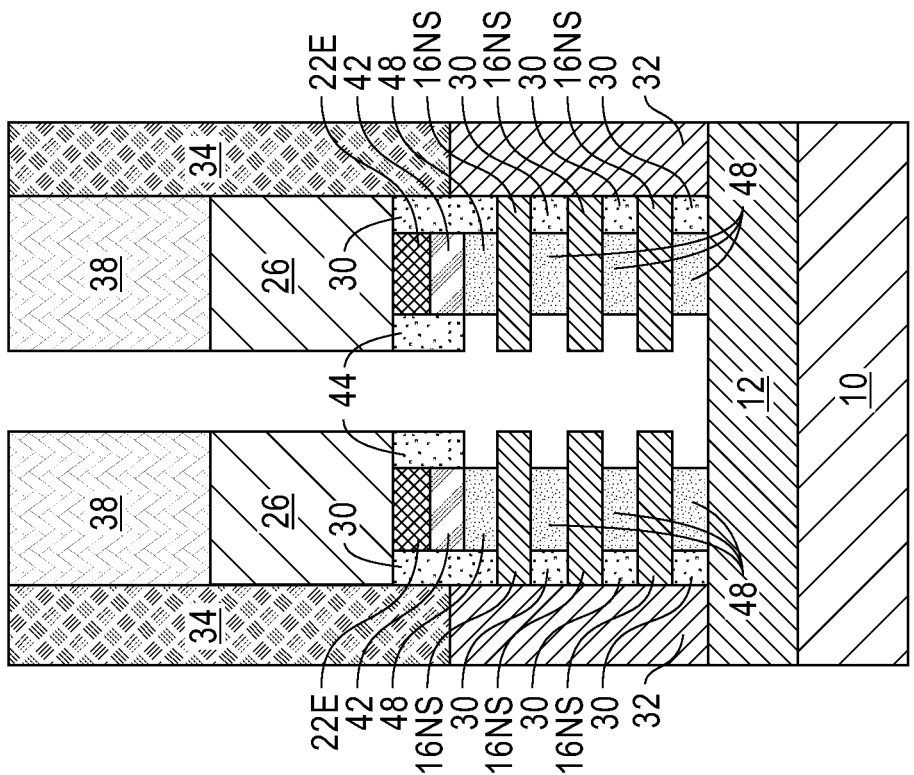

Referring now to FIGS. 18A and 18B, there are illustrated the exemplary semiconductor structure shown in FIGS. 17A and 17B, respectively, after forming a gate structure 48 including a gate dielectric layer and a gate electrode The gate dielectric layer and the gate electrode are not separately shown but both are included in the gate structure 48. As is known, the gate dielectric layer is formed in contact with surfaces of each of the semiconductor channel material nanosheets 16NS, and the gate electrode is located on the gate dielectric layer.

The gate structure 48 is formed in the area previously accompanied by the sacrificial semiconductor material nanosheets 14NS and the patterned sacrificial semiconductor layer 18 (i.e., gate cavity 47). The gate structure 48 wraps around each of the semiconductor material nanosheets 16NS within each nanosheet stack. The gate dielectric layer of the gate structure 48 is composed of a gate dielectric material that has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide (BaO$_6$SrTi$_2$), barium titanium oxide (BaTiO$_3$), strontium titanium oxide (SrTiO$_3$), yttrium oxide (Yb$_2$O$_3$), aluminum oxide (Al$_2$O$_3$), lead scandium tantalum oxide (Pb(Sc,Ta)O$_3$), and/or lead zinc niobite (Pb(Zn,Nb)O). The gate dielectric material can further include dopants such as lanthanum (La), aluminum (Al) and/or magnesium (Mg).

The gate electrode of the gate structure 48 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co).

The gate structure 48 can be formed by deposition of the gate dielectric material and the gate electrode material, followed by an etch that removes the gate dielectric material and gate electrode material that is formed outside the gate cavity 47.

Figure 19B:
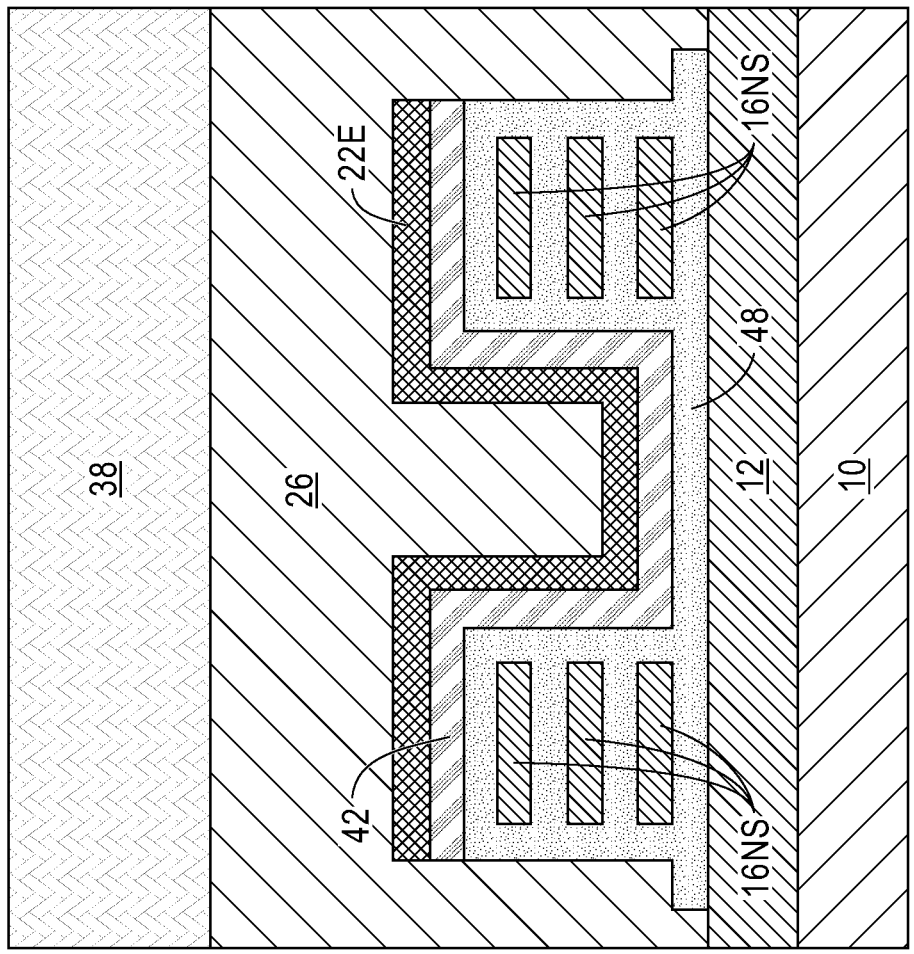
FIGS. 19A and 19B are cross sectional views of the exemplary semiconductor structure shown in FIGS. 18A and 18B, respectively, after forming additional second inner spacers and second source/drain regions.
Figure 19A:
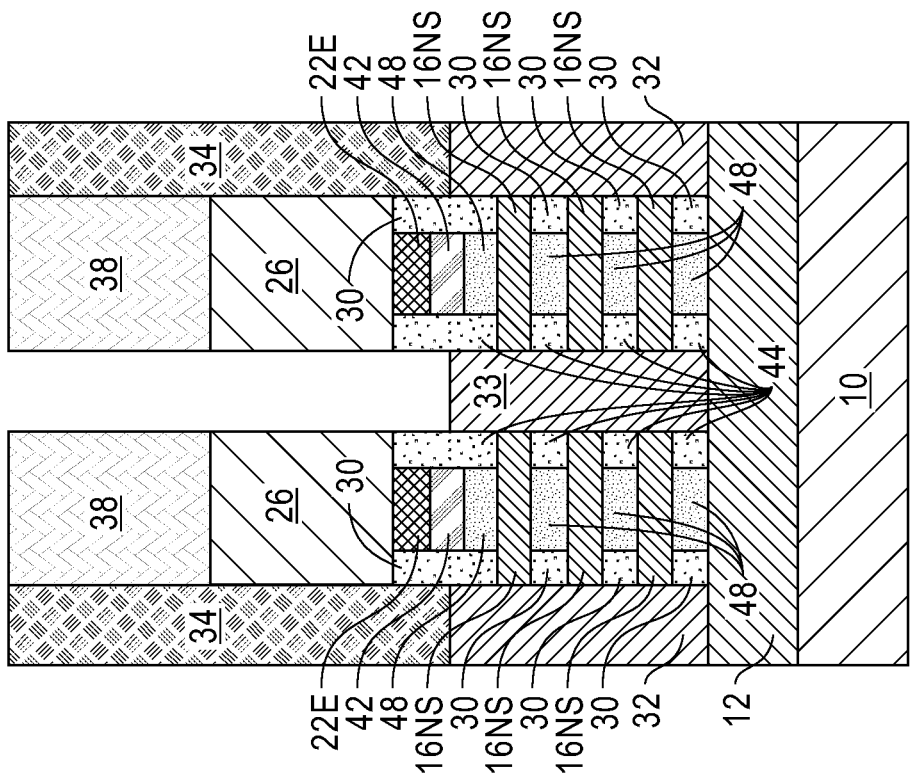

Referring now to FIGS. 19A and 19B, there are illustrated the exemplary semiconductor structure shown in FIGS. 18A and 18B, respectively, after forming additional second inner spacers 44 and second source/drain regions 33. The additional second inner spacers 44 include one of the spacer dielectric materials mentioned above for the first inner spacers 30. The topmost second inner spacer 44 has a height that is greater than the other second inner spacers 44 since it includes a combination of the previously formed second inner spacer 44 and an additional second inner spacer. The topmost second inner spacer 44 lines the sidewalls of conductive metal liner 22, non-conductive layer 42 and a topmost portion of the gate structure 48. The additional second inner spacers 44 are formed by deposition of the spacer dielectric material, followed by a spacer etch. In some embodiments, the second source/drain region 33 includes the same semiconductor material and doped as the first source/drain regions 32. In such embodiments, the second source/drain regions 33 can be formed by epitaxial growth as defined above. In other embodiments, the second source/drain regions 32 can be composed of a metallic material such as, for example, Cu, W, Al, Pt, Pd, Cr, or Nb; thus a metallic source/drain region can be formed in the present application. Metallic source/drain regions can be formed by deposition, followed by a recess etch. In the present application, the first source/drain region 32 is located on a first side of the nanosheet stacks, while the second source/drain region 33 is formed on a second side of the nanosheet stacks; each first and second source/drain region pair forms a GAA source/drain region.

Referring now to FIGS. 20A and 20B, there are illustrated the exemplary semiconductor structure shown in FIGS. 19A and 19B, respectively, after forming a second ILD layer 50, S/D contact structures 52A, and gate contact structures 52B. The second ILD layer 50 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The second ILD layer 50 can be formed by a deposition process including, but not limited to, CVD, PECVD or spin-on coating. A planarization process such as, for example, CMP can follow the deposition process.

The S/D contact structures 52A and gate contact structures 52B can be formed by a metallization process that includes forming contact openings and filling the contact openings with at least a contact conductor material. Filling includes deposition and etching. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The S/D contact structures 52A and gate contact structures 52B can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. In the illustrated embodiment shown in FIG. 20B, the non-conductive material/gate dielectric area ratio is less than 1.

Referring now to FIGS. 21-23, there are illustrated alternative exemplary semiconductor structure of the present application. The exemplary semiconductor structures shown in FIGS. 21-23 can be formed utilizing the basis processes steps illustrated in FIGS. 2A-20B above. In the illustrated embodiment shown in FIG. 21, the non-conductive material/gate dielectric area ratio is less than 1 and smaller than that in FIG. 20B. In the illustrated embodiment shown in FIG. 22, the non-conductive material/gate dielectric area ratio is less than 1 and smaller than that in FIG. 21. In the illustrated embodiment shown in FIG. 23, the non-conductive material/gate dielectric area ratio is at maximum. FIGS. 20B-23 illustrate that the present application provides a tunable non-conductive material/gate dielectric area ratio and is not constrained to the periphery of the nanosheet stack cross-section.

It is noted that the above provides one GAA formation process that can be used in forming a semiconductor structure that includes a first GAA transistor located in a first active area and a second GAA transistor located in a second active area, wherein the first GAA transistor and the second GAA transistor include a shared gate structure in series with a shared non-conductive layer; a metal electrode contacting the shared non-conductive layer, wherein the metal electrode has a same width as the shared non-conductive layer; and a gate contact structure contacting the metal electrode. Other GAA processing flows can also be used and adapted to form a semiconductor structure in accordance with the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first gate-all-around (GAA) transistor located in a first active area and a second GAA transistor located in a second active area, wherein the first GAA transistor and the second GAA transistor comprise a shared gate structure in series with a shared non-conductive layer;
   a metal electrode contacting the shared non-conductive layer, wherein the metal electrode has a same width as the shared non-conductive layer; and
   a gate contact structure contacting the metal electrode.

2. The semiconductor structure of claim 1, wherein the shared non-conductive layer entirely covers the shared gate structure located above an uppermost semiconductor channel material nanosheet of the first GAA transistor, and entirely covers the shared gate structure located above an uppermost semiconductor channel material nanosheet of the second GAA transistor.

3. The semiconductor structure of claim 2, wherein the shared non-conductive layer further covers an entirety of the shared gate structure that is present between the first active area and the second active area.

4. The semiconductor structure of claim 1, wherein the shared non-conductive layer partially covers the shared gate structure located above an uppermost semiconductor channel material nanosheet of the first GAA transistor, and partially covers the shared gate structure located above an uppermost semiconductor channel material nanosheet of the second GAA transistor.

5. The semiconductor structure of claim 4, wherein the shared non-conductive layer covers an entirety of the shared gate structure that is present between the first active area and the second active area.

6. The semiconductor structure of claim 1, wherein the shared non-conductive layer is located entirely in an area between the first active area and the second active area and is spaced apart from inner facing sidewalls of the shared gate structure of both the first GAA transistor and the second GAA transistor.

7. The semiconductor structure of claim 1, wherein the semiconductor structure has a non-conductive material to gate dielectric area ratio that is less than 1.

8. The semiconductor structure of claim 1, wherein the shared non-conductive layer extends an entire width of the shared gate structure.

9. The semiconductor structure of claim 8, wherein the semiconductor structure has a non-conductive material to gate dielectric area ratio that is at a maximum.

10. The semiconductor structure of claim 1, wherein the shared non-conductive layer comprises a ferroelectric material, an antiferroelectric material, or a combination thereof.

11. The semiconductor structure of claim 1, wherein the first GAA transistor and the second GAA transistor are located on a surface of an insulator layer that is located on a semiconductor substrate.

12. The semiconductor structure of claim 11, wherein the shared gate structure that is located between the first active area and the second active area is capacitively coupled to the insulator layer.

13. The semiconductor structure of claim 1, wherein the first GAA transistor and the second GAA transistor are located on a surface of a semiconductor substrate.

14. The semiconductor structure of claim 13, wherein the shared gate structure that is located between the first active area and the second active area is capacitively coupled to the semiconductor substrate.

15. The semiconductor structure of claim 1, wherein the gate contact structure which contacts the metal electrode is located in an area between the first active area and the second active area.

16. The semiconductor structure of claim 1, wherein the gate contact structure which contacts the metal electrode is located on top of the first active area or the second active area.

17. The semiconductor structure of claim 1, wherein the first GAA transistor is of a different conductivity type than the second GAA transistor.

18. The semiconductor structure of claim 1, wherein each of the first GAA transistor and the second GAA transistor includes source/drain regions.

19. The semiconductor structure of claim 18, wherein a first source/drain region of the source/drain regions comprises a semiconductor material and a dopant, and a second source/drain region of the source/drain regions is a metallic source/drain region.

20. The semiconductor structure of claim 18, wherein each of the source/drain regions are comprised of metal.

* * * * *